(12) United States Patent
Tanaka et al.

(10) Patent No.: US 12,288,677 B2
(45) Date of Patent: Apr. 29, 2025

(54) VERTICALLY ADJUSTABLE PLASMA SOURCE

(71) Applicant: Applied Materials, Inc., Santa Clara, CA (US)

(72) Inventors: Tsutomu Tanaka, Santa Clara, CA (US); Jared Ahmad Lee, San Jose, CA (US); Rakesh Ramadas, San Jose, CA (US); Dmitry A. Dzilno, Sunnyvale, CA (US); Gregory J. Wilson, Kalispell, MT (US); Sriharish Srinivasan, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 14 days.

(21) Appl. No.: 18/205,690

(22) Filed: Jun. 5, 2023

(65) Prior Publication Data

US 2023/0307213 A1 Sep. 28, 2023

Related U.S. Application Data

(63) Continuation of application No. 17/134,280, filed on Dec. 26, 2020, now Pat. No. 11,705,312.

(51) Int. Cl.
*H01J 37/32* (2006.01)

(52) U.S. Cl.
CPC .. *H01J 37/32733* (2013.01); *H01J 37/32082* (2013.01); *H01J 37/3244* (2013.01);
(Continued)

(58) Field of Classification Search
CPC .......... H01J 37/32733; H01J 37/32082; H01J 37/32522; H01J 37/3244; H01J 2237/332; H01J 2237/20235
See application file for complete search history.

(56) References Cited

U.S. PATENT DOCUMENTS 5,217,560 A 6/1993 Yoichi et al.
6,084,198 A 7/2000 Birx
(Continued)

FOREIGN PATENT DOCUMENTS

CN 101420816 A 4/2009
CN 104025286 A 9/2014
(Continued)

OTHER PUBLICATIONS

PCT International Search Report and Written Opinion in PCT/US2018/013320 dated May 3, 2018, 11 pages.
(Continued)

*Primary Examiner* — Yuechuan Yu
(74) *Attorney, Agent, or Firm* — Servilla Whitney LLC

(57) ABSTRACT

The disclosure describes a plasma source assemblies comprising a differential screw assembly, an RF hot electrode, a top cover, an upper housing and a lower housing. The differential screw assembly is configured to provide force to align the plasma source assembly vertically matching planarity of a susceptor. More particularly, the differential screw assembly increases a distance between the top cover and the upper housing to align the gap with the susceptor. The disclosure also provides a better thermal management by cooling fins. A temperature capacity of the plasma source assemblies is extended by using titanium electrode. The disclosure provides a cladding material covering a portion of a first surface of RF hot electrode, a second surface of RF hot electrode, a bottom surface of RF hot electrode, a portion of a surface of the showerhead and a portion of lower housing surface.

20 Claims, 10 Drawing Sheets

(52) U.S. Cl.
CPC .................. *H01J 37/32522* (2013.01); *H01J 2237/20235* (2013.01); *H01J 2237/332* (2013.01)

(56) References Cited

U.S. PATENT DOCUMENTS

| | | | |
|---|---|---|---|
| 7,172,792 | B2 | 2/2007 | Wang et al. |
| 9,685,406 | B1 | 6/2017 | Briggs et al. |
| 10,763,085 | B2 | 9/2020 | Bera et al. |
| 10,903,056 | B2 | 1/2021 | Bera et al. |
| 2002/0170676 | A1 | 11/2002 | Mitrovic et al. |
| 2003/0129107 | A1 | 7/2003 | Denes et al. |
| 2005/0016457 | A1 | 1/2005 | Kawasaki et al. |
| 2006/0084283 | A1 | 4/2006 | Paranjpe et al. |
| 2006/0260748 | A1 | 11/2006 | Nogami et al. |
| 2007/0283888 | A1 | 12/2007 | Schmitt |
| 2008/0088097 | A1 | 4/2008 | Tanaka |
| 2008/0274605 | A1 | 11/2008 | Hoshi et al. |
| 2009/0102385 | A1 | 4/2009 | Wi |
| 2009/0104351 | A1 | 4/2009 | Kakegawa |
| 2010/0062613 | A1 | 3/2010 | Kim et al. |
| 2010/0215871 | A1 | 8/2010 | Lee |
| 2011/0036499 | A1 | 2/2011 | Lee et al. |
| 2011/0201134 | A1 | 8/2011 | Hoffman et al. |
| 2012/0058649 | A1* | 3/2012 | Okumura .................. H05H 1/28 438/798 |
| 2012/0115317 | A1 | 5/2012 | Okumura et al. |
| 2012/0255678 | A1 | 10/2012 | Holland et al. |
| 2013/0097840 | A1 | 4/2013 | Schaefer et al. |
| 2013/0206067 | A1 | 8/2013 | Kato |
| 2014/0225003 | A1 | 8/2014 | Koo et al. |
| 2014/0235003 | A1 | 8/2014 | Jung et al. |
| 2014/0273527 | A1 | 9/2014 | Niskanen et al. |
| 2015/0048739 | A1 | 2/2015 | Forster et al. |
| 2015/0179519 | A1 | 6/2015 | Rho |
| 2015/0200076 | A1 | 7/2015 | Koo et al. |
| 2015/0262792 | A1 | 9/2015 | Bera |
| 2015/0303037 | A1 | 10/2015 | Ha et al. |
| 2015/0357165 | A1 | 12/2015 | Takahashi |
| 2016/0148806 | A1 | 5/2016 | Henri et al. |
| 2016/0153086 | A1 | 6/2016 | Kwak et al. |
| 2016/0220953 | A1 | 8/2016 | Wamura |
| 2017/0148626 | A1* | 5/2017 | Subramani ........ H01L 21/68771 |
| 2017/0213702 | A1 | 7/2017 | Hammond, IV |
| 2018/0330927 | A1* | 11/2018 | Bera ................. H01L 21/68764 |
| 2019/0180985 | A1 | 6/2019 | Tanaka et al. |
| 2019/0189400 | A1 | 6/2019 | Ohno et al. |
| 2019/0376186 | A1 | 12/2019 | Haverkamp et al. |

FOREIGN PATENT DOCUMENTS

| | | |
|---|---|---|
| CN | 105102675 A | 11/2015 |
| CN | 105474362 A | 4/2016 |
| JP | 2003338399 A | 11/2003 |
| JP | 2009105030 A | 5/2009 |
| JP | 2010001551 A | 1/2010 |
| JP | 2010153351 A | 7/2010 |
| JP | 2010532717 A | 10/2010 |
| JP | 2014220502 A | 11/2014 |
| JP | 2015119045 A | 6/2015 |
| JP | 2019056130 A | 4/2019 |
| KR | 20050065779 A | 8/2005 |
| KR | 20110018230 A | 2/2011 |
| KR | 20120119903 A | 10/2012 |
| KR | 20140004570 A | 1/2014 |
| KR | 101461139 B1 | 11/2014 |
| KR | 20190103558 A | 6/2019 |
| TW | 201515525 A | 4/2015 |
| TW | 201515528 A | 4/2015 |
| TW | 201714493 A | 4/2017 |
| WO | 2004/057653 A2 | 7/2004 |
| WO | 2014104751 A1 | 7/2014 |

OTHER PUBLICATIONS

PCT International Search Report and Written Opinion in PCT/US2021/064362 dated Jun. 7, 2022, 10 pages.

Alvarez, et al., "Low Temperature Thermal ALD of Silicon Nitride Utilizing a Novel High Purity Hydrazine Source", IOP Science ECS Abstracts, vol. Ma2018-02, G02 Atomic Layer Deposition Applications 14, 2018 (Year: 2018).

Andringa, Anne-Marije, et al., "Low-Temperature Plasma-Assisted Atomic Layer Deposition of Silicon Nitride Moisture Permeation Barrier Layers", ACS Appl. Mater. Interfaces 2015, 7, 22525-22532.

Edmonds, Mary, et al., "Low temperature thermal ALD of a SiNx interfacial diffusion barrier and interface passivation layer on $SixGe1-x(001)$ and $SixGe1-x(110)$", J. Chem. Phys. 146, 052820 (2017).

Goto, Hiroshi, et al., "Atomic layer controlled deposition of silicon nitride with self-limiting mechanism", Appl. Phys. Lett. 68, 3257 (1996); https://doi.org/10.1063/1.116566, Jun. 4, 1998.

Nakajima, Anri, et al., "Low-temperature formation of silicon nitride gate dielectrics by atomic-layer deposition", Appl. Phys. Lett. 79, 665 (2001); https://doi.org/10.1063/1.1388026, Jul. 23, 2001.

* cited by examiner

VERTICALLY ADJUSTABLE PLASMA SOURCE

CROSS-REFERENCE TO RELATED APPLICATIONS

This application is a Continuation Application of U.S. patent application Ser. No. 17/134,280, filed Dec. 26, 2020, the entire disclosure of which is hereby incorporated by reference herein.

TECHNICAL FIELD

Embodiments of the disclosure generally relate to an apparatus for processing substrates. More particularly, embodiments of the disclosure relate to modular plasma sources for use with processing chambers like batch processors.

BACKGROUND

Semiconductor device formation is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

Some ALD systems, especially spatial ALD systems with rotating substrate platens, benefit from a modular plasma source, i.e., a source that can be easily inserted into the system. The plasma source consists of a volume where plasma is generated, and a way to expose a workpiece to a flux of charged particles and active chemical radical species.

Thermal ALD and CVD processes frequently incorporate treatments for film quality enhancements. These treatments typically comprise energetic or reactive species. Plasma sources are a primary source for such species. Some concerns of plasma sources include energetic bombardment through ions and contamination of materials from the plasma source due to sputtering.

For linear radial plasma sources in any system with a rotating susceptor (also called a platen), the plasma exposure (treatment) is larger at the wafer inner diameter compared to the outer diameter by a factor of about 2.7. Therefore, for uniform plasma exposure, the plasma should be stronger at the outer diameter than the inner diameter. Therefore, there is a need in the art for plasma sources that achieve uniform plasma exposure in rotating platen processing systems.

SUMMARY

One or more embodiments of the disclosure are directed to plasma sources comprising a top cover, an upper housing, a lower housing and an RF hot electrode. The top cover has an inner peripheral edge, an outer peripheral edge, a top surface and a bottom surface. The upper housing has an inner peripheral edge and an outer peripheral edge, a top surface and a bottom surface. The upper house is connected to and spaced a distance from the bottom surface of the top cover by one or more differential screw assembly. The lower housing has an inner peripheral edge and an outer peripheral edge. The lower housing has a top surface in contact with to the bottom surface of the upper housing and a bottom surface. The RF hot electrode is bounded by and spaced from the lower housing and has an inner end adjacent to and spaced from the inner peripheral edge of the lower housing. An outer end of the RF hot electrode is adjacent to and spaced from the outer peripheral edge of the lower housing and an upper edge is spaced from the bottom surface of the upper housing.

Additional embodiments of the disclosure are directed to plasma sources comprising an upper housing, a lower housing, a top cover, an RF hot electrode, a gas inlet, a plurality of apertures and a cladding layer. The upper housing has an inner peripheral edge and an outer peripheral edge, a top surface and a bottom surface. The lower housing has an inner peripheral edge and an outer peripheral edge. The lower housing has a top surface in contact with to the bottom surface of the upper housing and a bottom surface. The lower housing acts as a return electrode. The top cover has an inner peripheral edge, an outer peripheral edge, a top surface and a bottom surface. The top cover is connected to and spaced a distance from the top surface of the upper housing by one or more differential screw assembly. The RF hot electrode is bounded by and spaced from the lower housing. The RF hot electrode has an inner end adjacent to and spaced from the inner peripheral edge of the lower housing, an outer end adjacent to and spaced from the outer peripheral edge of the lower housing, and an upper edge spaced from the bottom surface of the upper housing and a bottom edge. The gas inlet is connected to the top surface of the upper housing and is in fluid communication through the upper housing with a plenum gap between the bottom surface of the upper housing and the top surface of the lower housing. The plurality of apertures are in the top surface of the lower housing to allow a flow of gas to pass from the plenum gap through a non-conductive showerhead to the gap between the RF hot electrode and the lower housing. The non-conductive showerhead separates the RF hot electrode and the top surface of the lower housing comprising a conductive material. The non-conductive showerhead has a plurality of apertures extending from a top surface of the showerhead through a bottom surface of the showerhead to allow the flow of gas to pass through the non-conductive showerhead into the gap. The cladding layer covers a bottom portion of an inside surface of the lower housing, a portion of the bottom surface of the non-conductive showerhead and the return electrode to form an inverted u-shaped channel on either side of the RF hot electrode. The cladding includes a plurality of apertures to allow a flow of gas from the non-conductive showerhead to pass into the inverted u-shaped channel on either side of the RF hot electrode.

Further embodiments of the disclosure are directed to methods of aligning a plasma source. A matching planarity is determined for the plasma source assembly to a top surface of the susceptor assembly to find a first adjustment parameter. A distance required between the top surface of the susceptor assembly and the plasma source assembly is determined to find a second adjustment parameters. The first adjustment parameter is revised based on the second adjustment parameter to find a third parameter. The position of the plasma source is vertically adjusted based on the third parameter.

BRIEF DESCRIPTION OF THE DRAWINGS

So that the manner in which the above recited features of embodiments of the disclosure can be understood in detail, a more particular description of embodiments of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
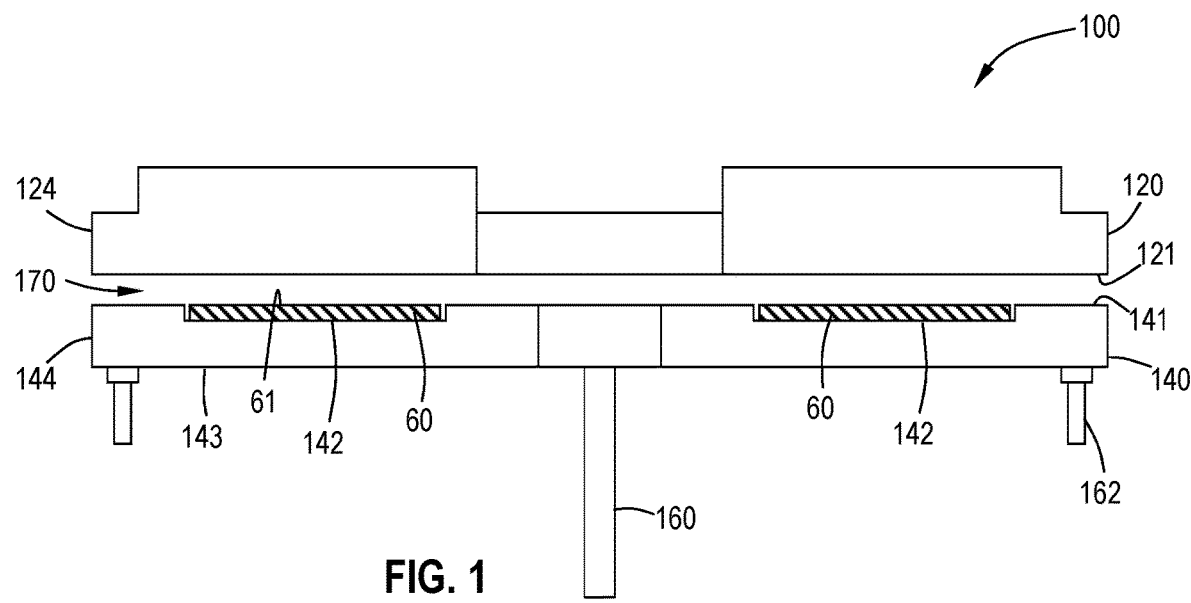
FIG. 1 shows a schematic cross-sectional view of a substrate processing system in accordance with one or more embodiments of the disclosure.

Embodiments of the disclosure provide a substrate processing system for continuous substrate deposition to maximize throughput and improve processing efficiency. The substrate processing system can also be used for pre-deposition and post-deposition plasma treatments.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

As used in this specification and the appended claims, the term "reduced pressure" means a pressure less than about 100 Torr, or less than about 75 Torr, or less than about 50 Torr, or less than about 25 Torr. For example, "medium pressure" defined as in the range of about 1 Torr to about 25 Torr is reduced pressure.

Rotating platen chambers are being considered for many applications. In such a chamber, one or more wafers are placed on a rotating holder ("platen"). As the platen rotates, the wafers move between various processing areas. For example, in ALD, the processing areas would expose the wafer to precursors and reactants. In addition, plasma exposure may be used as a reactant or to treat the film or the substrate surface for enhanced film growth or to modify film properties. Some embodiments of the disclosure provide for uniform deposition and post-treatment (e.g., densification) of ALD films when using a rotating platen ALD chamber.

Rotating platen ALD chambers can deposit films by traditional time-domain processes where the entire wafer is exposed to a first gas, purged and then exposed to the second gas, or by spatial ALD where portions of the wafer are exposed to the first gas and portions are exposed to the second gas and the movement of the wafer through these gas streams deposits the layer.

As used in this specification and the appended claims, the terms "pie-shaped" and "wedge-shaped" are used interchangeably to describe a body that is a sector of a circle. For example, a wedge-shaped segment may be a fraction of a circle or disc-shaped structure and multiple wedge-shaped segments can be connected to form a circular body. The sector can be defined as a part of a circle enclosed by two radii of a circle and the intersecting arc. The inner edge of the pie-shaped segment can come to a point or can be truncated to a flat edge or rounded. In some embodiments, the sector can be defined as a portion of a ring or annulus.

The path of the substrates can be perpendicular to the gas ports. In some embodiments, each of the gas injector assemblies comprises a plurality of elongate gas ports which extend in a direction substantially perpendicular to the path traversed by a substrate, where a front edge of the gas ports is substantially parallel to the platen. As used in this specification and the appended claims, the term "substantially perpendicular" means that the general direction of movement of the substrates is along a plane approximately perpendicular (e.g., about 45° to 90°) to the axis of the gas ports. For a wedge-shaped gas port, the axis of the gas port can be considered to be a line defined as the mid-point of the width of the port extending along the length of the port.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial ALD gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
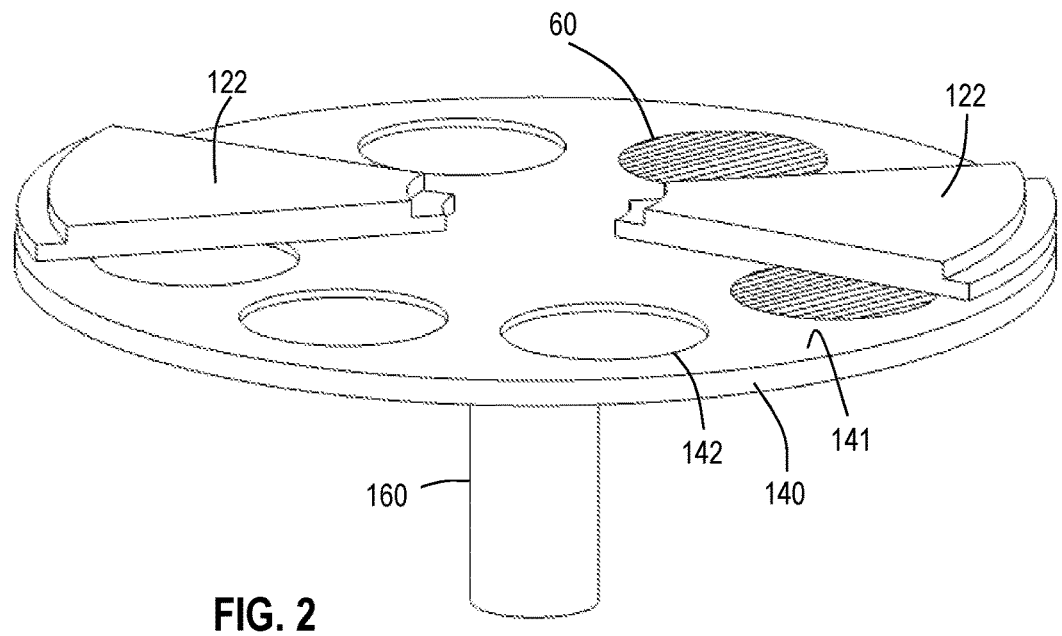
FIG. 2 shows a perspective view of a substrate processing system in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm. The recess 142 of some embodiments supports a wafer so that the inner diameter (ID) of the wafer is located within the range of about 170 mm to about 185 mm from the center (axis of rotation) of the susceptor. In some embodiments, the recess 142 supports a wafer so that the outer diameter (OD) of the wafer is located in the range of about 470 mm to about 485 mm from the center (axis of rotation) of the susceptor.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120. In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
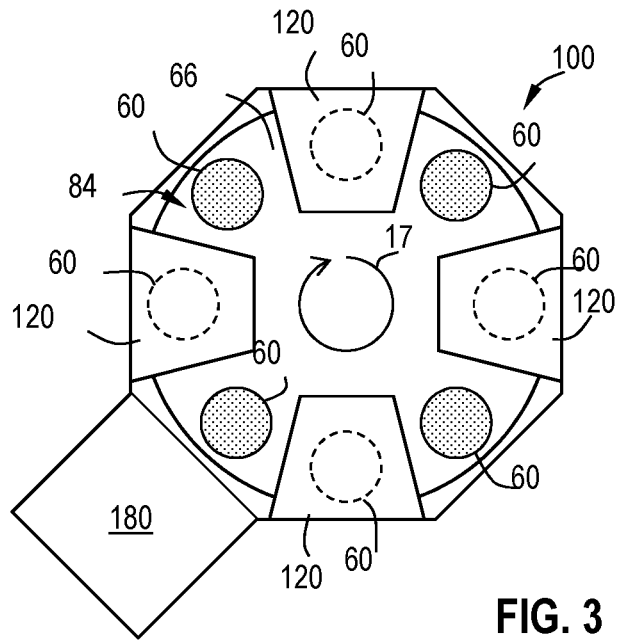
FIG. 3 shows a schematic of a substrate processing system in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. With spatial ALD injectors, a film is deposited on the wafer during movement of the wafer relative to the injector assembly. In some embodiments, the susceptor assembly 140 is rotated in increments that prevent the substrates 60 from stopping beneath the gas distribution assemblies 120. The number of substrates 60 and gas distribution assemblies 120 can be the same or different. In some embodiments, there is the same number of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal, however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the processing chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
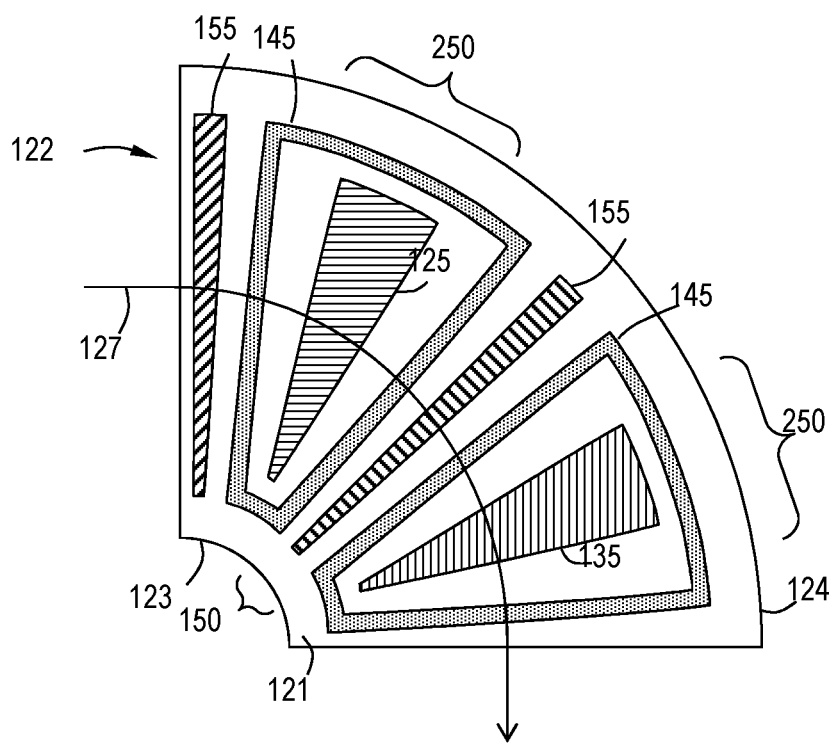
FIG. 4 shows a schematic view of a front of a gas distribution assembly in accordance with one or more embodiment of the disclosure.
Figure 5:
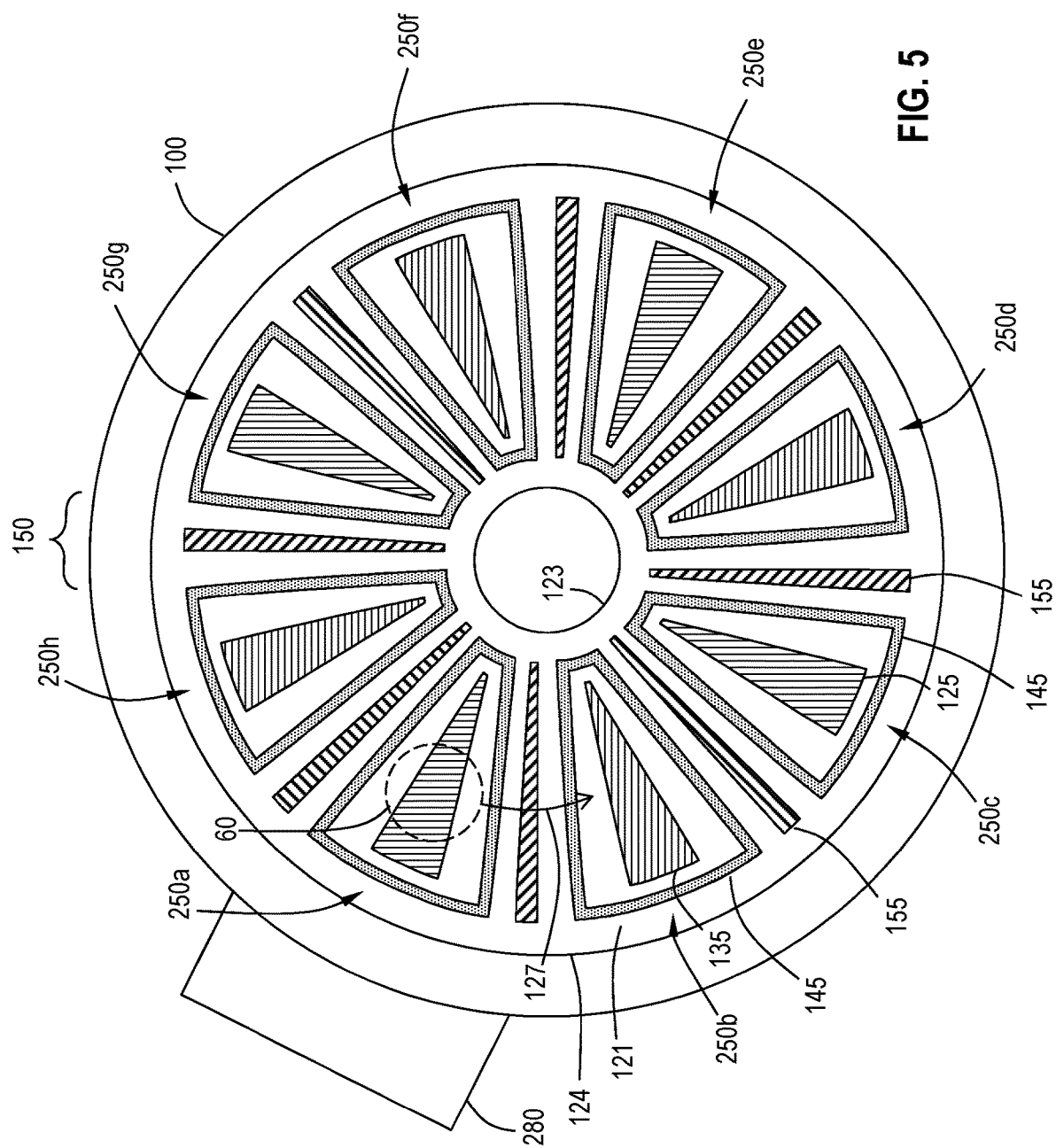
FIG. 5 shows a schematic view of a processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second reactive gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145 and vacuum ports 155 extend from an area adjacent the inner peripheral edge 123 toward an area adjacent the outer peripheral edge 124 of the gas distribution assembly 220. The plurality of gas ports shown include a first reactive gas port 125, a second reactive gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second reactive gas port 135 and a vacuum port 145. Thus, at the end of the path 127 shown in FIG. 4, the substrate has been exposed to gas streams from the first reactive gas port 125 and the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second reactive gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual reactive gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, ten, eleven or twelve processing regions.

During processing, a substrate may be exposed to more than one processing region 250 at any given time. However, the portions that are exposed to the different processing regions will have a gas curtain separating the two. For example, if the leading edge of a substrate enters a processing region including the second reactive gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120 (also referred to as a gas distribution plate). The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150*a*, 150*b*. Rotating the substrate 60 along path 127 will move the substrate counterclockwise around the processing chamber 100. Thus, the substrate 60 will be exposed to the first processing region 250*a* through the eighth processing region 250*h*, including all processing regions between. For each cycle around the processing chamber, using the gas distribution assembly shown, the substrate 60 will be exposed to four ALD cycles of first reactive gas and second reactive gas.

The conventional ALD sequence in a batch processor, like that of FIG. 5, maintains chemical A and B flow respectively from spatially separated injectors with pump/purge section between. The conventional ALD sequence has a starting and ending pattern which might result in non-uniformity of the deposited film. The inventors have surprisingly discovered that a time based ALD process performed in a spatial ALD batch processing chamber provides a film with higher uniformity. The basic process of exposure to gas A, no reactive gas, gas B, no reactive gas would be to sweep the substrate under the injectors to saturate the surface with chemical A and B respectively to avoid having a starting and ending pattern form in the film. The inventors have surprisingly found that the time based approach is especially beneficial when the target film thickness is thin (e.g., less than 20 ALD cycles), where starting and ending pattern have a significant impact on the within wafer uniformity performance. The inventors have also discovered that the reaction process to create SiCN, SiCO and SiCON films, as described herein, could not be accomplished with a time-domain process. The amount of time used to purge the processing chamber results in the stripping of material from the substrate surface. The stripping does not happen with the spatial ALD process described because the time under the gas curtain is short.

Accordingly, embodiments of the disclosure are directed to processing methods comprising a processing chamber 100 with a plurality of processing regions 250*a*-250*h* with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250*a*-250*h*. The number of gas curtains is generally equal to or greater than the number of processing regions. For example, if region 250*a* had no reactive gas flow, but merely served as a loading area, the processing chamber would have seven processing regions and eight gas curtains.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250*b* through processing region 250*h*, an inert gas would be flowing into processing region 250*a*. The inert gas can be flowed through the first reactive gas port 125 or the second reactive gas port 135.

The inert gas flow within the processing regions can be constant or varied. In some embodiments, the reactive gas is co-flowed with an inert gas. The inert gas of some embodiments acts as a carrier and/or diluent. Since the amount of reactive gas, relative to the carrier gas, is small, co-flowing may make balancing the gas pressures between the processing regions easier by decreasing the differences in pressure between adjacent regions.

Some embodiments of the disclosure are directed to injector modules. While the injector modules are described with respect to a spatial ALD processing chamber, those skilled in the art will understand that the modules are not limited to spatial ALD chambers and can be applicable to any injector situation where increasing gas flow uniformity is useful.

Some embodiments of the disclosure advantageously provide modular plasma source assemblies, i.e., a source that can be easily inserted into and removed from the processing system. Such a source may have all or most of its hardware operating at the same pressure level as the atomic layer deposition process, typically 1-50 Torr. Some embodiments of the disclosure provide plasma sources with improved ion flux across the wafer surface. In some embodiments, plasma sources include a capacitive source between three plates aligned substantially perpendicular to the wafer surface. In some embodiments, the outer plates are grounded and the inner plate is powered. A plasma can be created between the plates while the gas species flows between the plates toward the wafer surface. The plasma is substantially confined to the source and minimizes sputtered material from the powered plate reaching the wafer surface. Some embodiments of the disclosure advantageously provide a plasma source that minimizes or eliminates contamination of the substrate by material sputtered from the hot electrode. Some embodiments also advantageously provide a soft plasma that does not substantially change of the substrate surface. One or more embodiments provide an apparatus that can generate a plasma without allowing the electrical return path to go through the substrate. Some embodiments of the disclosure provide modular remote plasma sources that can be added to or removed from a gas distribution assembly. The remote plasma source generates a plasma without using the substrate or substrate support as an electrode.

The plasma source comprises a housing and an RF hot electrode. The housing may further comprise a top cover, an upper housing and a lower housing, wherein each have an inner peripheral edge, an outer peripheral edge, a top surface and a bottom surface. In some embodiments, the top cover, the upper housing and the lower housing are stacked over each other such that the top surface of the upper housing faces the bottom surface of the top cover and the bottom surface of the upper housing faces the top surface of the lower housing.

The RF hot electrode bounded may be bounded by and spaced from the lower housing. The RF hot electrode has an inner end adjacent to and spaced from the inner peripheral edge of the lower housing, an outer end adjacent to and spaced from the outer peripheral edge of the lower housing and an upper edge spaced from the bottom surface of the upper housing.

In some embodiments, the plasma source further comprises an RF feed connector. In some embodiments, the RF feed connector passes through the top plate into a recess formed in the top surface of the upper housing. In some embodiments, the RF hot electrode extends from the RF feed connector through the upper housing. In some embodiments, a coaxial RF feed and the RF hot electrode are connected inside the RF feed connector. In some embodiments, the RF feed is insulated by the insulating sleeve. In some embodiments, the RF hot electrode is insulated by a ceramic insulator inside the upper house. The RF feed connector applies RF power to the hot RF electrode. The RF feed connector applies the RF power in a range of from 1 MHz to 200 MHz, 10 MHz to 200 MHz, 20 MHz to 200 MHz, 40 MHz to 200 MHz, 60 MHz to 200 MHz, 80 MHz to 200 MHz, 100 MHz to 200 MHz, 1 MHz to 150 MHz, 1 MHz to 100 MHz, 1 MHz to 80 MHz, 1 MHz to 60 MHz, 1 MHz to 40 MHz or 1 MHz to 20 MHz. In some embodiments, the RF feed connector has a power connector end with a hard stop to prevent force applied by a power line connected to the power connector end from transferring to the RF hot electrode.

In some embodiments, the lower housing acts as a ground plate (also referred to as a return plate). The gap between the RF hot electrode (the powered electrode) and the ground plate (referred to as the return electrode) can be varied. In some embodiments, the gap is in the range of about 3 mm to about 15 mm and may be adjustable. The width of the RF hot electrode can be varied. For example, the plates can be tapered to accelerate ions. In use, the gaseous species flowing in the gap between the RF hot electrode and the return electrode become ionized. The ionized species can then contact the substrate surface. In some embodiments, the plasma formed is a soft plasma that does not substantially change the substrate surface.

Additionally, the plasma source 300 further comprises a gas inlet. The gas inlet is connected to the top surface of the upper housing. The gas inlet is in fluid communication through the upper housing with a plenum gap between the bottom surface of the upper housing and the top surface of the lower housing. The top surface of the lower housing comprises a plurality of apertures extending through the lower housing to allow a flow of gas to pass through the lower housing from the plenum gap to a gap between the RF hot electrode and the lower housing. The lower housing comprises a conductive material and is spaced from the RF hot electrode by a non-conductive showerhead, the non-conductive showerhead having a plurality of apertures extending there through to allow the glow of gas to pass through the non-conductive showerhead into the gap.

In some embodiments, the modular plasma source 300 further comprises a top plate. The plate has an inner an inner peripheral edge, an outer peripheral edge, a top surface and a bottom surface. The plate can be affixed on the top cover, wherein the top surface of the top cover faces the bottom surface of the top plate.

The disclosure advantageously provides a solution to the issues of non-uniform plasma density and plasma exposure non-uniformity. Some embodiments decrease plasma damage on the wafer by allowing fine distance control through vertical adjustment of the modular plasma source. In some embodiments, the distance control enables control of the plasma source planarity and matching across the top surface 141 of the susceptor assembly 140 and the recess 142. In some embodiments, electrode position control ensures that the electrode is always in the lowest position in the assembly instead of floating within an undetermined distance.

In some embodiments, adjustability is achieved using a differential screw assembly and the separation of the upper housing from the top cover. In some embodiments, the differential screw assembly comprises an adjustment screw extending through the top cover into the upper housing. In some embodiments, the upper housing includes an adjustment recess in the top surface with a compression element, the compression element configured to provide force to the bottom surface of the top cover to space the top cover apart from the upper housing. The space between the upper housing and the top cover is within an adjustable range of the differential screw assembly. In some embodiments, the differential screw assembly has an adjustable range of from 0.05 mm to 20 mm, 0.05 mm to 15 mm, 0.05 mm to 10 mm, 0.05 mm to 8 mm, 0.05 mm to 6 mm, 0.05 mm to 4 mm, 0.05 mm to 2 mm or 0.05 mm to 1 mm.

In some embodiments, adjustability is achieved using the differential screw assembly and the separation of the top plate from the top cover. The differential screw assembly of some embodiments comprises an adjustment screw extending through the top plate into the top cover. The top cover of some embodiments has an adjustment recess in the top surface with a compression element, the compression element configured to provide force to the bottom surface of the top plate to space the top plate apart from the top cover. The space between the top plate and the top cover is within an adjustable range of the differential screw assembly. In particular, the differential screw assembly of some embodiments has an adjustable range of from 0.05 mm to 20 mm, 0.05 mm to 15 mm, 0.05 mm to 10 mm, 0.05 mm to 8 mm, 0.05 mm to 6 mm, 0.05 mm to 4 mm, 0.05 mm to 2 mm or 0.05 mm to 1 mm.

In some embodiments, adjustability is achieved using the differential screw assembly and the separation of the upper housing from the top cover. The differential screw assembly of some embodiments comprises an adjustment screw extending through the top plate and the top cover into the upper housing. The top cover in some embodiments has an adjustment recess in the top surface with a compression element, the compression element configured to provide force to the bottom surface of the top cover to space the top cover apart from the upper housing. The space between the top cover and the upper housing is within an adjustable range of the differential screw assembly. In particular, the differential screw assembly of some embodiments has an adjustable range of from 0.05 mm to 20 mm, 0.05 mm to 15 mm, 0.05 mm to 10 mm, 0.05 mm to 8 mm, 0.05 mm to 6 mm, 0.05 mm to 4 mm, 0.05 mm to 2 mm or 0.05 mm to 1 mm.

In some embodiments, the differential screw assembly is connected to an external processor. In some embodiments, the external processor controls the differential screw assembly to adjust the distance between the gap 340, 340*b* and the substrate 60. In some embodiments, the external processor controls the differential screw assembly by a distance feed back mechanism. In some embodiments, the distance feed back mechanism is based on one or more pressure sensitive projections or optically active objects. In some embodiments, the pressure sensitive projections are located on and protruding out from the susceptor assembly 140 or the modular plasma source 300. In some embodiments, the height of the pressure sensitive projection is adjustable. In some embodiments, the height of the pressure sensitive projection is adjustable. In some embodiments, the height of the pressure sensitive projection is adjusted based on a substrate height determining feedback mechanism, the substrate height feedback mechanism determines the height of the substrate 60. In some embodiments, the optically active objects are located on the susceptor assembly 140 or the modular plasma source 300. In some embodiments, the distance between the substrate 60 and the gap 340, 340b is based on the substrate height feedback mechanism.

In some embodiments, the susceptor assembly 140 includes one or more actuators 162 (see FIG. 1) configured to make micro-adjustments to the susceptor assembly 140 to create a predetermined gap 170 between the susceptor assembly 140 and the gas distribution assembly 120. In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The plasma source requires efficient thermal management. In some embodiments the top cover is actively cooled. In some embodiments, the plasma source comprises cooling wings for actively cooling the top cover. In some embodiments, the plasma source further comprises one or more chamber cooling plates extending from the top surface of the upper housing into a complementary recess formed in the bottom surface of the top cover. When the differential screw assembly is used to adjust the gap between the top cover and the upper housing, the thermal management of the plasma source may be impacted. The disclosure provides a solution to improve the thermal management of the plasma source having differential screw assembly. The disclosure provides additional of internal cooling fins between the upper housing and top cover and cooling wings that create contact between the top cover and chamber cooling plates. Gaps between the wings and cooling plate resulting from tolerance stack-up are filled using shims or a thermal interface material. In some embodiments, the plasma source further comprises one or more cooling fins extending from the bottom surface of the top cover into a complementary recess formed in the top surface of the upper housing.

In some embodiments, temperature capability of the assembly is extended by changing the electrode material from aluminum to titanium. In some embodiments, temperature capability of the assembly is extended by using titanium electrode.

Electrode position control ensures the vertical position of the electrode is controlled across all assemblies and chambers. In some embodiments, the vertical position is accomplished by pushing the electrode down by the showerhead above it. In some embodiments, the force is limited by using o-rings or springs to transfer the force.

Referring to FIGS. 6 through 15, one or more embodiments of the disclosure are directed to modular capacitively coupled plasma sources 300. In some embodiments, the plasma source is a modular inductively coupled plasma (ICP) source. As used in this specification and the appended claims, the term "modular" means that plasma source 300 can be attached to or removed from a processing chamber. A modular source can generally be moved, removed or attached by a single person.

Figure 6:
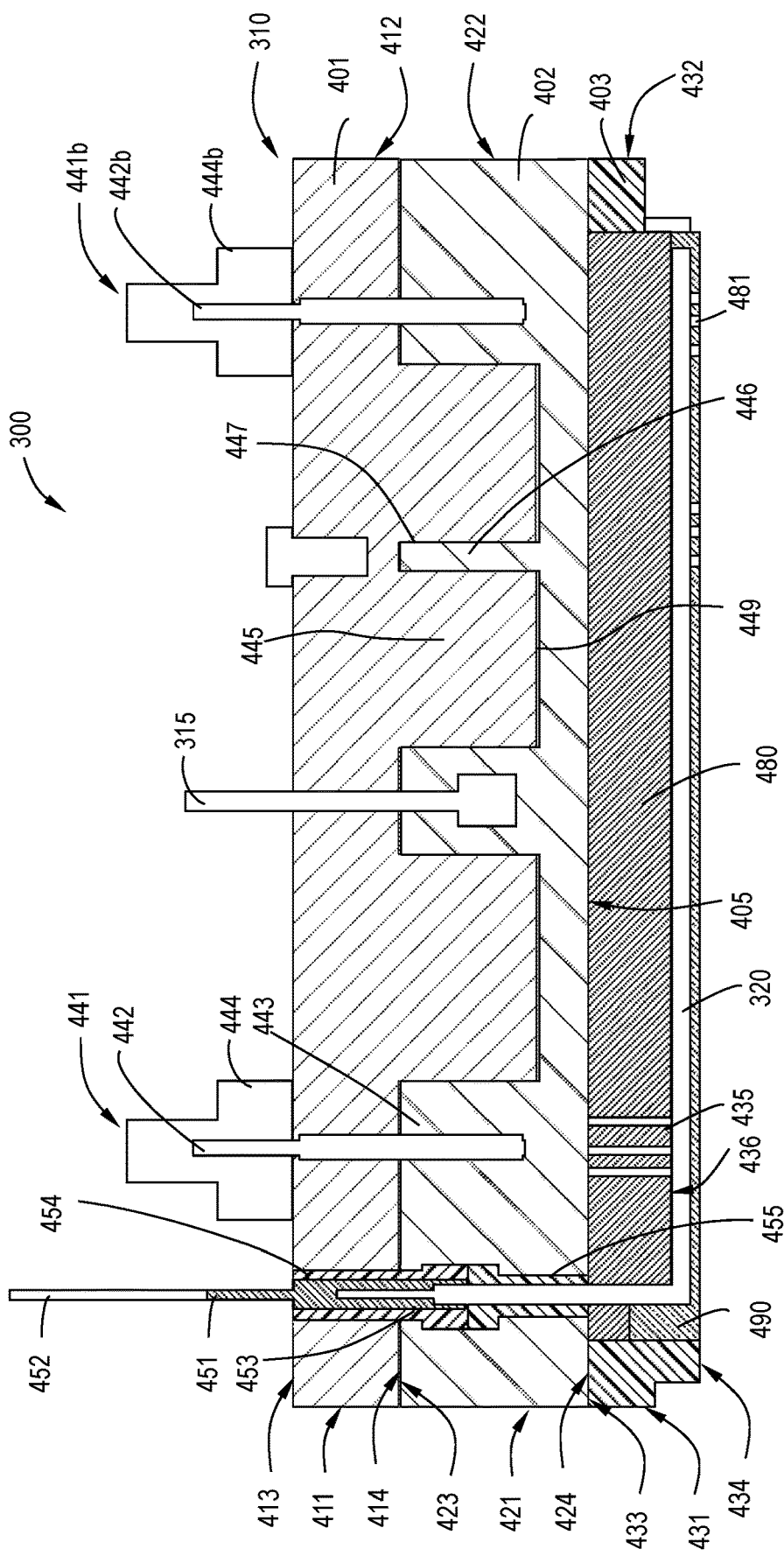
FIG. 6 shows a partial cross-sectional side schematic of a plasma source assembly electrodes in accordance with one or more embodiments of the disclosure.

FIG. 6 shows a cross-sectional schematic side view of a plasma source assembly 300 in accordance with one or more embodiment of the disclosure. The plasma source assembly 300 shown in FIG. 6 includes a housing 310, an RF hot electrode 320 and a gas inlet 315.

The housing 310 comprises a top cover 401, an upper housing 402 and a lower housing 403. The top cover 401 has an inner peripheral edge 411, an outer peripheral edge 412, a top surface 413 and a bottom surface 414.

The upper housing 402 has an inner peripheral edge 421, an outer peripheral edge 422, a top surface 423 and a bottom surface 424. The upper housing 402 is connected with the bottom surface 414 of the top cover 401 using one or more differential screw assembly 441, 441b. In some embodiments, the upper housing 402 is connected to and spaced a distance (gap 449) from the bottom surface 414 of the top cover 401 by one or more differential screw assembly 441, 441b.

The lower housing 403 has an inner peripheral edge 431, an outer peripheral edge 432, a top surface 433 and a bottom surface 434. The top surface 433 of the lower housing 403 is in contact with the bottom surface 424 of the upper housing 402.

The RF hot electrode 320 extends from an RF feed connector 451 through one or more of the top cover 401 or the upper housing 402. A coaxial RF feed 452 enters into (i.e., connects to) the RF connector 451. In some embodiments, the RF connector 451 is positioned within a recess 453 formed in the top surface 413 of the upper housing 402. The skilled artisan will recognize that the Figures show the powered contact (the inner conductor) of the coaxial RF feed 452 and the return contact (the outer conductor) is not illustrated. The skilled artisan will understand the connections and electrical pathways of the coaxial RF feed 452 and will be able to assembly the disclosed plasma source assembly without undue experimentation. The embodiment illustrated and described has the inner conductor of the coaxial RF feed powering the RF hot electrode 320; however this is merely representative of one possible configuration and should not be taken as limiting the scope of the disclosure. The skilled artisan will understand that the outer conductor of the coaxial RF feed can be connected to the RF hot electrode and the inner conductor can act as the return path for the applied power.

The inner conductor of the RF connector 451 is insulated from the top cover 401 by an insulating sleeve 454. In some embodiments, the insulating sleeve 454 extends into the recess 453 formed in the back surface 423 of the upper housing 402.

FIG. 6 shows the RF hot electrode 320 insulated from the upper housing 402 by a ceramic insulator 455 passing through at least a portion of the upper housing 402. The RF hot electrode 320 passes through an insulating sleeve 456 positioned within the upper housing 402, the insulating sleeve 454 and ceramic insulator 455 prevents direct electrical communication between the RF hot electrode 320 and the upper housing 402. Similarly, a liner 490 prevents direct electrical communication between the RF hot electrode 320 and the lower housing 403.

The differential screw assembly 441, 441b has an adjustment screw 442, 442b extending through the top cover 401 into the upper housing 402. The upper housing 402 has an adjustment recess 443 in the top surface 423 with a compression element 444, the compression element 444, 444b configured to provide force to the bottom surface 414 of the top cover 401 to separate the top cover 401 from the upper housing 402.

In some embodiments, the top cover 401 is actively cooled. Active cooling can be by any suitable technique known to the skilled artisan including, but not limited to, flowing a fluid through cooling channels formed in the top cover or a Peltier device. Separating the top cover 401 from the upper housing 402 increases the gap 449 and changes the thermal conductivity between components.

The plasma source in FIG. 6 shows a cooling plate 446 extending from the top surface 423 of the upper housing 402 into a complementary recess 447 formed in the bottom surface 414 of the top cover 401. In some embodiments, a cooling wing 445 extends from the bottom surface 414 of the top cover 401 into a recess 448 formed in the top surface 423 of the upper housing 402. Stated differently, in some embodiments, complementary features (cooling plate 446, complementary recess 447, cooling wing 445 and recess 448) are configured and arranged to provide increased surface area contact between the top cover 401 and the upper housing 402. In some embodiments, the complementary features are arranged and/or configured to provide a variable gap 449 between the top cover 401 and the upper housing 402.

The gas inlet 315 is connected to the top surface 423 of the upper housing 402. The gas inlet 315 is in fluid communication through the upper housing 402 with a plenum gap 405 between the bottom surface 424 of the upper housing 402 and the top surface of the lower housing 403. The top surface of the lower housing 403 comprises a plurality of apertures 435. The apertures 435 allow a flow of gas to pass through the lower housing 403 from the plenum gap 405 to a gap 436 between the RF hot electrode 320 and the lower housing 403.

In some embodiments, the lower housing 403 comprises a conductive material and is spaced from the RF hot electrode 320 by a non-conductive showerhead 480. In some embodiments, the non-conductive showerhead 480 comprises a plurality of apertures 481 extending therethrough to allow the flow of gas to pass through the non-conductive showerhead 480 into the gap between the showerhead 480 and a substrate or substrate support. Stated differently, in some embodiments, the non-conductive showerhead 480 comprises a plurality of apertures 481 extending therethrough to allow a flow of gas to pass through the non-conductive showerhead 480.

Figure 7:
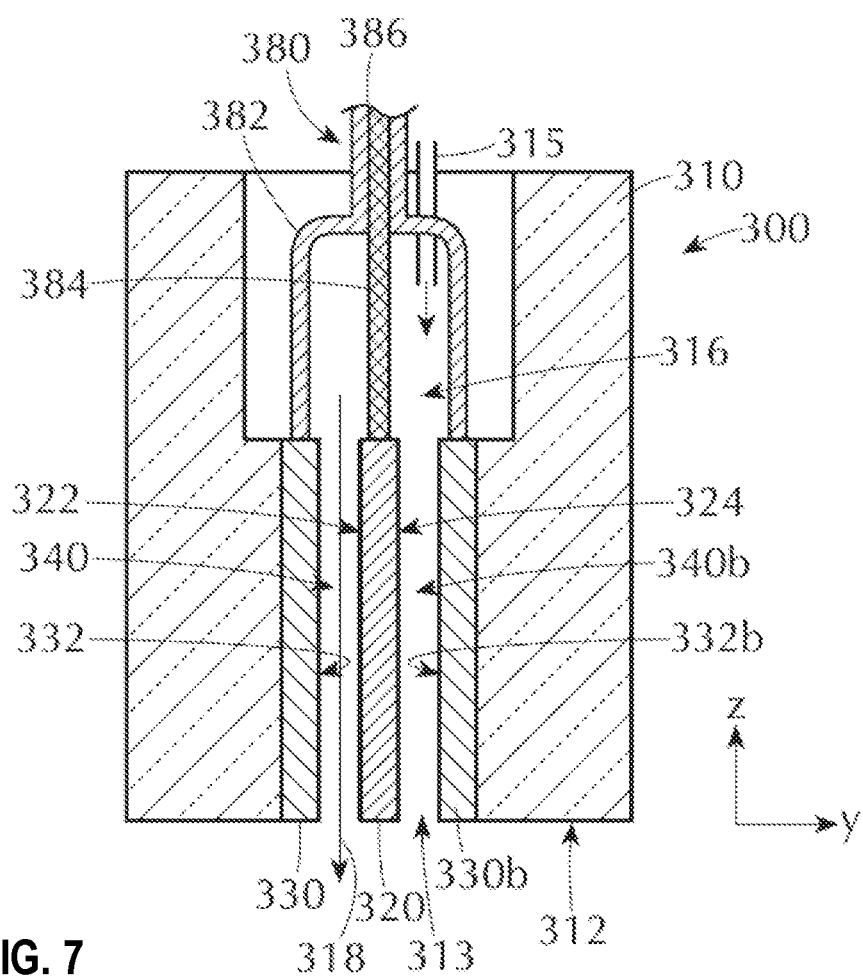
FIG. 7 shows a schematic cross-sectional view of a plasma source assembly in accordance with one or more embodiment of the disclosure.

FIG. 7 shows a cross-section of a plasma source assembly 300 in accordance with one or more embodiment of the disclosure. The plasma source assembly 300 shown in FIG. 7 includes a housing 310 with a gas inlet 315 and a front face 312. The gas inlet 315 allows a flow of gas to move along the flow path 318 through the housing 310 and out an opening 313 in the front face 312. The embodiment shown has a gas inlet 315 illustrated off-center for descriptive purposes, but those skilled in the art will understand that the gas inlet 315 can be centered in the housing 310. Additionally, some embodiments include a plenum 316 to increase the uniformity of the gas flow through the flow path 318. The plenum 316 of some embodiments is at least partially filled with a dielectric, which has a plurality of through holes and/or plenums to allow gas to reach the plasma cavity (gap 340, 340*b*) uniformly. The through holes and/or plenums have dimensions small enough to prevent plasma breakdown. In some embodiments, the through holes have diameters less than or equal to about 1 mm, 0.95 mm, 0.9 mm, 0.85 mm, 0.8 mm, 0.75 mm, 0.7 mm, 0.65 mm or 0.6 mm.

Figure 8:
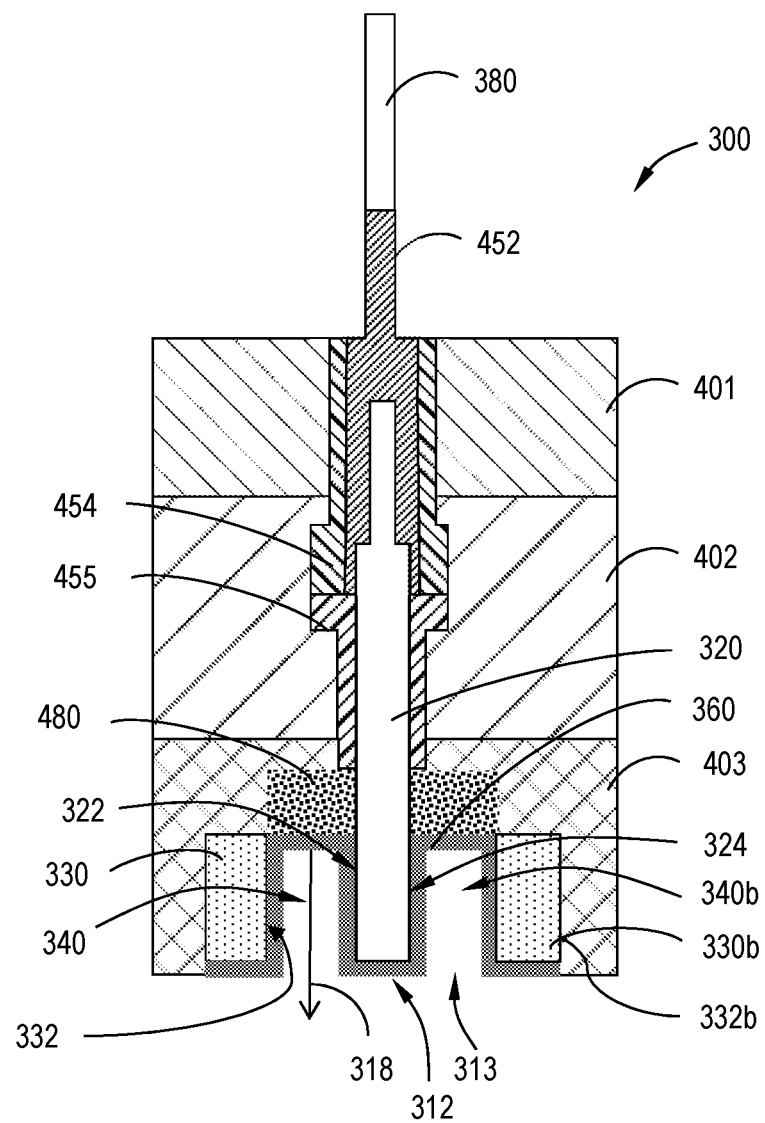
FIG. 8 shows a schematic cross-sectional view of a plasma source assembly in accordance with one or more embodiment of the disclosure.

FIG. 8 shows a cross-section of a plasma source assembly 300 in accordance with one or more embodiment of the disclosure. The plasma source assembly 300 shown in FIG. 8 includes a top cover 401, an upper housing 402 and a lower housing 403. The embodiment shown has a showerhead 480 that provides fluid communication for a flow of gas between the RF hot electrode 320 and the return electrodes (330 and 330*b*). In some embodiments, the showerhead 480 is non-conductive. The showerhead 480 allows gas to reach the plasma cavity (gap 340, 340*b*) uniformly through a plurality of apertures extending therethrough.

The plasma source assembly 300 includes an RF hot electrode 320 and at least one return electrode 330. The return electrode 330 is any conductive material that forms a complete circuit with the RF hot electrode 320. Those skilled in the art will understand that the return electrode 330 can provide a pathway for electrons to flow. The term "return" used in this manner means that the electrode is part of the electrical pathway of the plasma components and does not imply a direction for the flow of current or electrons.

Figure 9:
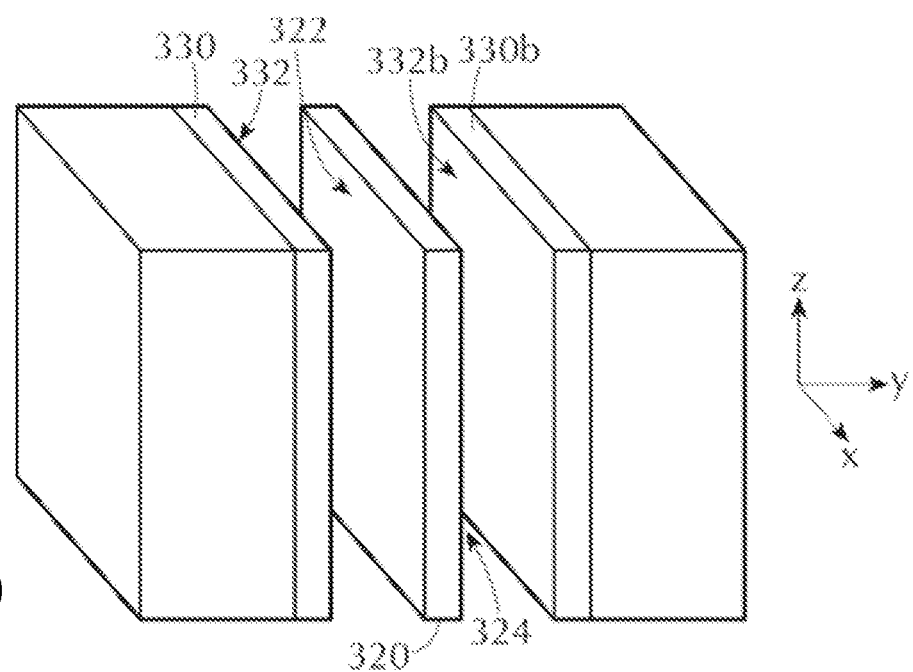
FIG. 9 shows a partial perspective view of a plasma source assembly in accordance with one or more embodiments of the disclosure.
Figure 10:
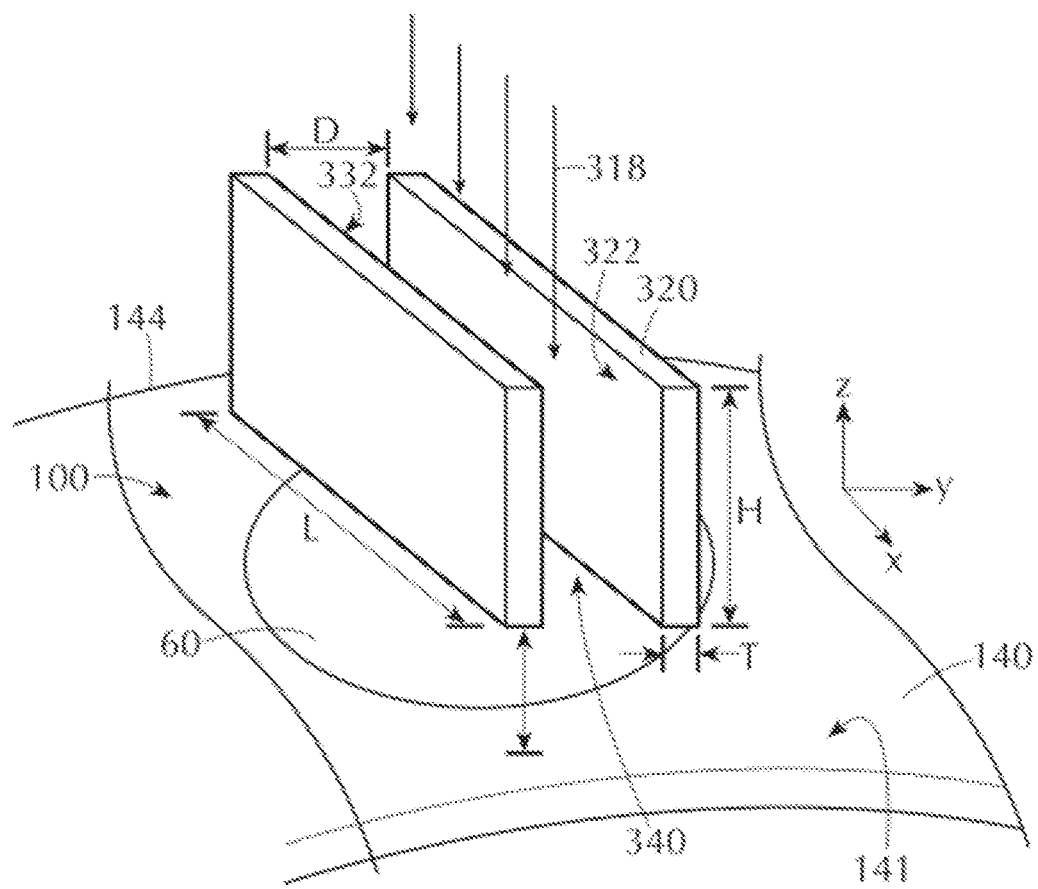
FIG. 10 shows a partial isometric view of a plasma source assembly in accordance with one or more embodiments of the disclosure.

Referring to FIGS. 7 to 10, the RF hot electrode 320 has a first surface 322 and a second surface 324 opposite the first surface 322. FIGS. 7 and 8 shows a cross-section of plasma source assemblies 300 while FIGS. 9 and 10 show partial perspective views of the electrodes. As used in this regard, the first surface 322 and second surface 324 are on opposite sides of the thickness T of the RF hot electrode 320. The RF hot electrode 320 is a generally shaped as a rectangular prism with a height H, thickness T and length L. The RF hot electrode 320 has a first surface 322 oriented substantially parallel to the flow path 318. As used in this regard, the term "substantially parallel" means that the surface is within ±10° of parallel (defined as 0°).

The return electrode 330 is similarly shaped to the RF hot electrode 320. The return electrode has a first surface 332 that is oriented substantially parallel to the flow path 318. The first surface 332 of the return electrode 330 is spaced from the first surface 322 of the RF hot electrode 320 to form a gap 340.

The return electrode 330,330*b* can be any suitable material including, but not limited to, aluminum, stainless steel and copper. The return electrode 330, 330*b* can have any suitable electrical characteristics. In some embodiments, the return electrode 330, 330*b* is a ground electrode. A ground electrode is any conductive material in electrical contact with electrical ground.

In some embodiments, the return electrode 330, 330*b* is a powered electrode different from the RF hot electrode 320. As used in this manner, "different from the RF hot electrode" means that the electrical properties or potential are different from the RF hot electrode. For example, the driving power of the generated plasma may be tuned in a push-pull manner from a single source using a phase shifter to minimize interaction with the wafer. In embodiments of this sort, the RF hot electrode 320 may be, for example, 180° out of phase with the return electrode 330. In some embodiments, the lower housing 403 acts as the return electrode 330.

As shown in FIG. 9, some embodiments of the plasma source assembly further comprise a second return electrode 330*b*. The second return electrode 330*b* has a first surface 332*b* which is oriented substantially parallel to the flow path 318. The first surface 332*b* of the second return electrode 330*b* is spaced from a second surface 324 of the RF hot electrode 320 to form a gap 340*b*. The gap 340 and gap 340*b* can have the same or different dimensions. In some embodiments, the gap 340, 340*b* between the RF hot electrode 320 and the return electrode 330, 330*b* is in the range of about 4 mm to about 15 mm, or in the range of about 5 mm to about 14 mm, or in the range of about 7 mm to about 13 mm, or in the range of about 9 mm to about 12 mm, or about 11 mm.

As shown in FIG. 10, the thickness T of the RF hot electrode 320 can be any suitable thickness depending on, for example, the electrode material. In some embodiments, the RF hot electrode has a thickness in the range of about 3 mm to about 11 mm, or in the range of about 4 mm to about 10 mm, or in the range of about 6 mm to about 9 mm or about 8 mm.

The height H of the RF hot electrode 320 can be varied. In some embodiments, the height H of the RF hot electrode 320 is in the range of about 8 mm to about 40 mm, or in the range of about 9 mm to about 35 mm, or in the range of about 10 mm to about 30 mm, or in the range of about 11 mm to about 25 mm, or in the range of about 12 mm to about 20 mm, or in the range of about 13 mm to about 15 mm or about 14 mm.

Figure 11:
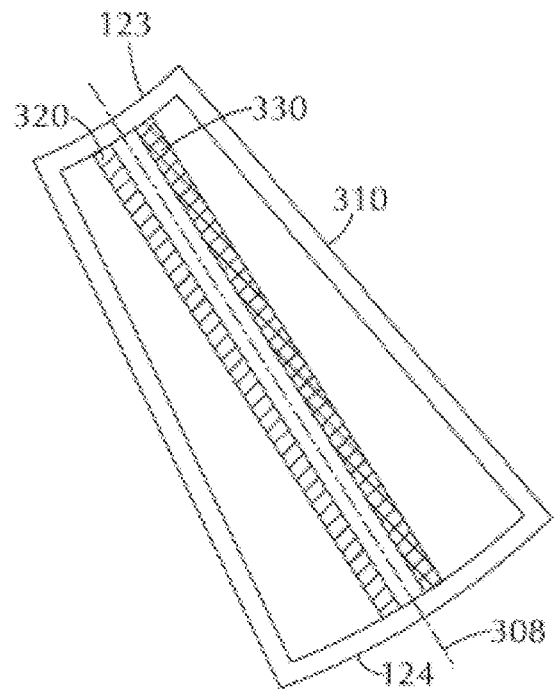
FIG. 11 shows a schematic bottom view of a plasma source assembly in accordance with one or more embodiments of the disclosure.

In some embodiments, the housing 310 of the plasma source assembly 300 is wedge-shaped. FIG. 11 shows an embodiment incorporating a wedge-shaped housing 310. As shown, the RF hot electrode 320 and the return electrode 330 extend along a major axis 308 of the housing 310. The major axis 308, as used in this manner, refers to the axis that extends through the middle of the arc forming the inner peripheral edge 123 and the middle of the arc forming the outer peripheral edge 124.

The spacing between the RF hot electrodes 320 and the return electrodes 330 can be substantially the same along the major axis 308 the plasma source assembly or can vary. For example, in some embodiments, the RF hot electrode and the return electrode are spaced further apart at the outer peripheral edge 124 of the wedge-shaped housing 310 than near the inner peripheral edge 123.

Figure 12:
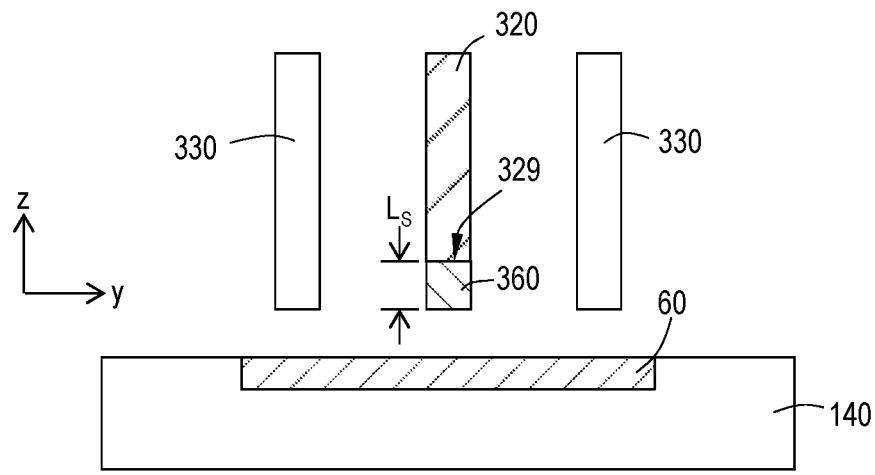
FIG. 12 shows a partial isometric view of a processing chamber with plasma source assembly in accordance with one or more embodiments of the disclosure.

The disclosure provides solution for plasma density and plasma uniformity related issues by reducing a distance through vertical adjustment of the assembly between the plasma cavity gap 340, 340b and the substrate 60 and susceptor assembly 140. In doing so, the RF hot electrode may increase sputtering and thereby contaminating the substrate 60. The disclosure provides solution to minimize sputtering and contamination by cladding. Some embodiments has a non-conductive cladding at a bottom surface of the RF hot electrode. In some embodiments, the non-conductive cladding comprises quartz. For example, FIG. 12 shows a cladding 360 adjacent a lower edge 329 of the RF hot electrode 320. The RF hot electrode 320 is illustrated between two return electrodes 330. A cladding 360 separates the lower edge 329 of the RF hot electrode 320 from the substrate 60 and susceptor assembly 140. The presence of the cladding 360, in some embodiments, helps prevent or minimize sputtering of the RF hot electrode 320 from contaminating the substrate 60. The cladding 360 can be made of any suitable material including, but not limited to, dielectrics (e.g., ceramic materials). The size of the cladding 360 can be adjusted to move the lower edge 329 of the RF hot electrode 320 to the vicinity of the substrate 60. In some embodiments, the cladding 360 has a length Ls in the range of about 10 mm to about 25 mm, or in the range of about 13 mm to about 20 mm or about 17 mm. The thickness of the cladding 360 can be in the range of from 0.25 mm to 2.5 mm, 0.5 mm to 2.0 mm or 0.75 mm to 1.5 mm.

Figure 13:
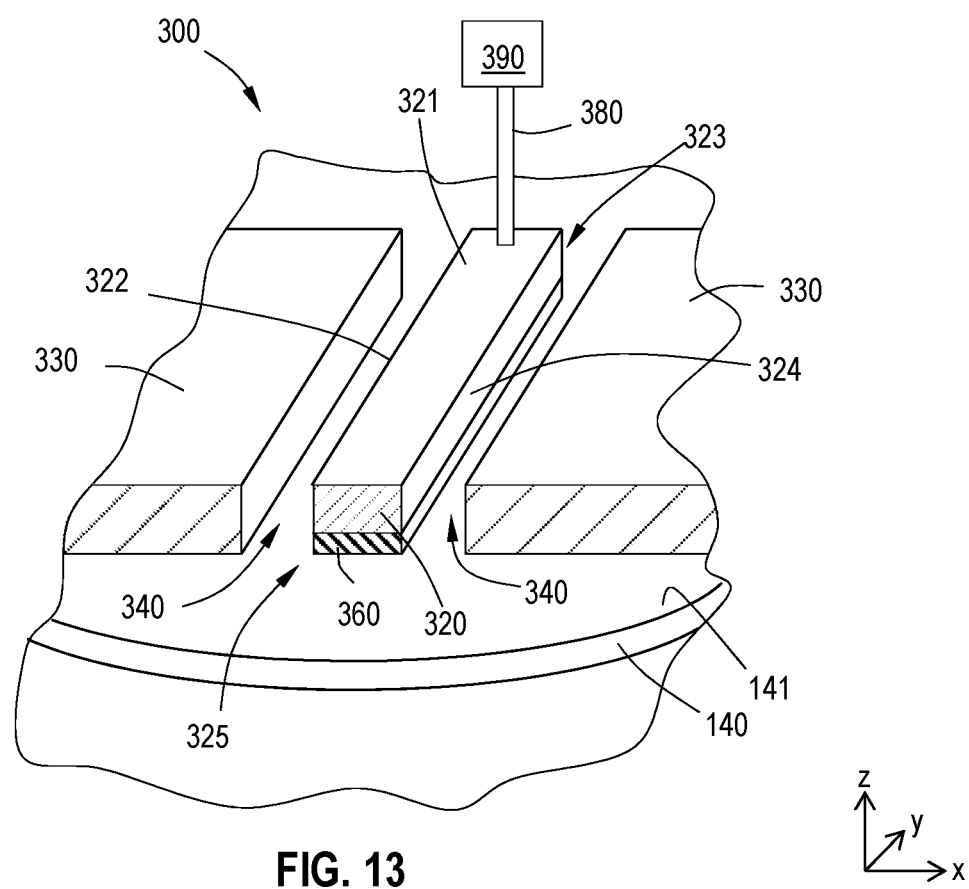
FIG. 13 shows a partial cross-sectional side schematic of a plasma source assembly electrodes in accordance with one or more embodiments of the disclosure.

Some embodiments include a cladding 360 adjacent a lower edge 329 of the RF hot electrode 320. Referring to FIG. 13, the RF hot electrode 320 is illustrated between two return electrodes 330. A cladding 360 separates the lower edge 329 of the RF hot electrode 320 from the substrate 60 and susceptor assembly 140. The presence of the cladding 360, in some embodiments, helps prevent or minimize sputtering of the RF hot electrode 320 from contaminating the substrate 60. The cladding 360 can be made of any suitable material including, but not limited to, dielectrics (e.g., ceramic materials). The size of the cladding 360 can be adjusted to move the lower edge 329 of the RF hot electrode 320 to the vicinity of the substrate 60. In some embodiments, the cladding 360 has a length Ls in the range of about 10 mm to about 25 mm, or in the range of about 13 mm to about 20 mm or about 17 mm. in some embodiments, the thickness of the cladding 360 can be in the range of from 0.25 mm to 2.5 mm, 0.5 mm to 2.0 mm or 0.75 mm to 1.5 mm.

Figure 16:
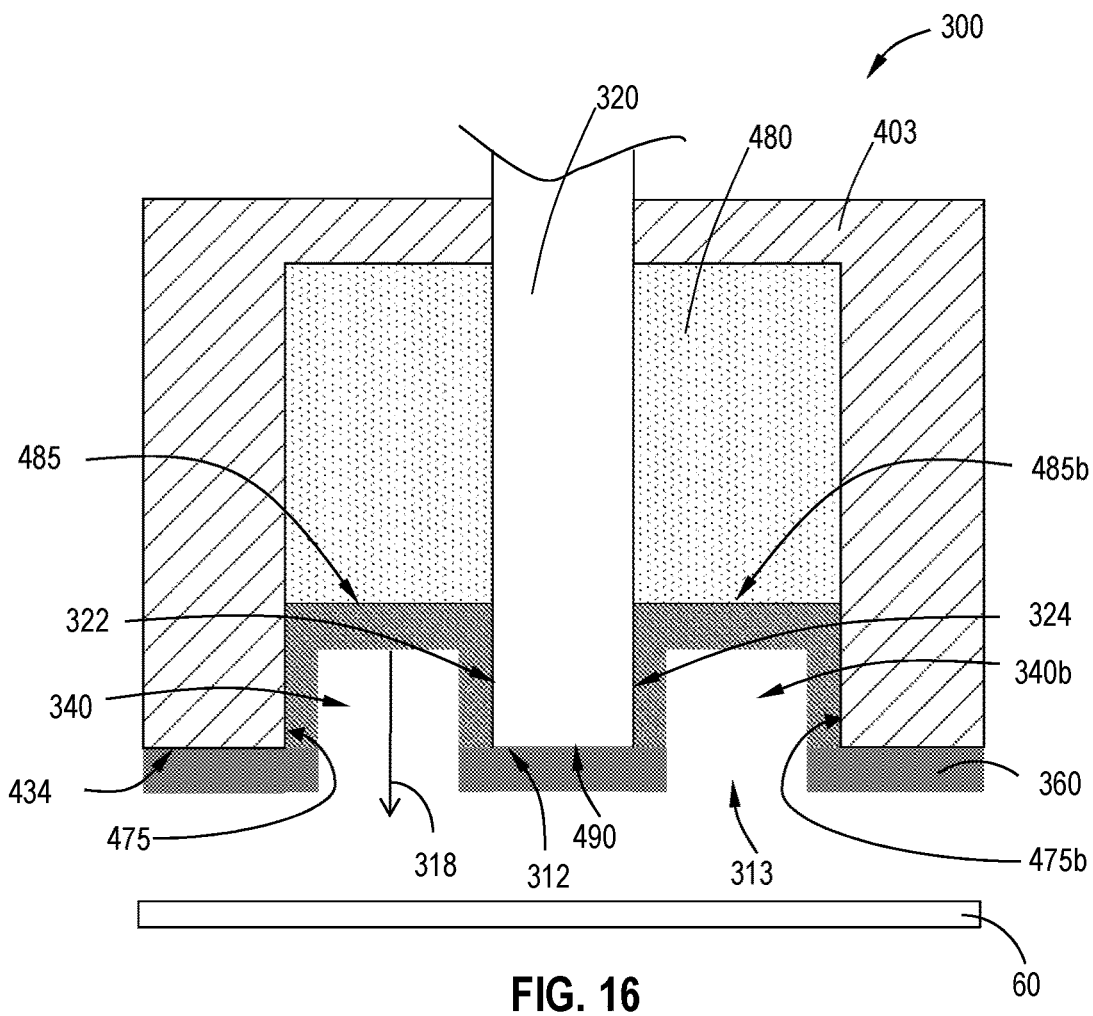
FIG. 16 shows a cross-sectional view of a plasma source assembly in accordance with one or more embodiments of the disclosure.

In some embodiments, the cladding covers a portion of a first side of the RF hot electrode and a portion of a second side of the RF hot electrode 320 that forms the gap. For example, as shown in FIG. 16, the cladding 360 covers a bottom surface of the RF hot electrode 320, a portion of a first side (first surface 322) of the RF hot electrode 320 and a portion of a second side (second surface 324) of the RF hot electrode that forms the gap 340, 340b.

In some embodiments, the cladding 360 further covers a portion of a surface of non-conductive showerhead and a portion of a surface of the lower housing that forms the gap. For example, as shown in FIG. 16, the cladding 360 also covers a portion of a surface of non-conductive showerhead 485, 485b, and a portion of a surface of the lower housing 475, 475b that forms the gap 340, 340b.

Referring to FIGS. 1, 2, 10 and 13, some embodiments of the disclosure are directed to processing chambers 100 including a susceptor assembly 140 and a gas distribution assembly 120. FIG. 13 shows an isometric view of a processing chamber 100 in accordance with one or more embodiments of the disclosure. The susceptor assembly 140 has a top surface 141 to support and rotate a plurality of substrates 60 around a central axis 161.

The gas distribution assembly 120 has a front surface 121 facing the top surface 141 of the susceptor assembly 140 to direct a flow of gases toward the top surface 141 of the susceptor assembly 140. The gas distribution assembly 120 of some embodiments includes a plasma source assembly 300 with a wedge-shaped housing 310. The wedge-shaped housing has an inner peripheral edge 123 and an outer peripheral edge 124 defining a major axis 308 of the housing 310. The housing 310 has a gas inlet 315 and a front face 312. A flow path is defined as the path followed by a gas flowing from the gas inlet 315 through the housing 310 and exiting from the front face 312.

Figure 15:
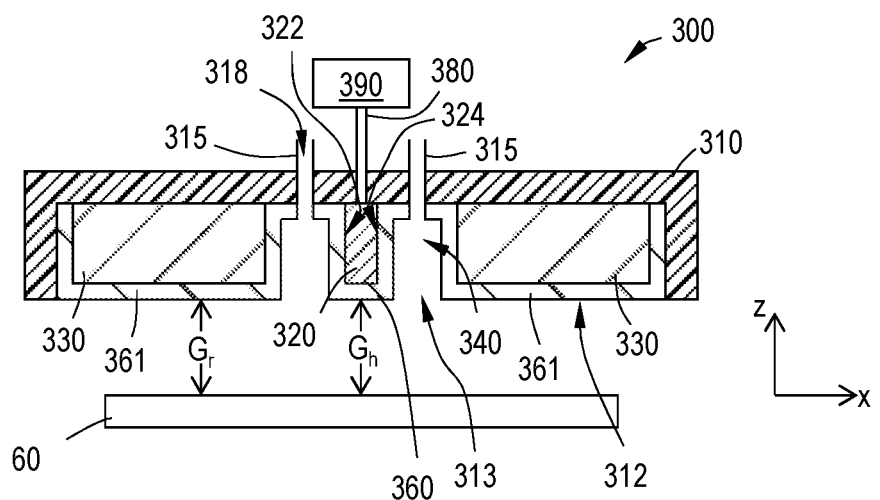
FIG. 15 shows a cross-sectional view of a plasma source assembly in accordance with one or more embodiments of the disclosure.

The plasma source assembly 300 has at least one RF hot electrode 320 with a first surface 322 oriented substantially parallel to the flow path. In the embodiment shown, there are three RF hot electrodes 320. At least one return electrode 330 is within the housing 310 and has a first surface 332 oriented parallel to the flow path and spaced from the first surface 322 of the RF hot electrode 320 to form a gap 340. The front face 312 of the wedge-shaped housing 310 of the plasma source assembly 300 is positioned a distance from the top surface 141 of the susceptor assembly 140 in the range of about 1 mm to about 5 mm, or in the range of about 1.5 mm to about 4 mm, or about 2 mm. The embodiment shown in FIG. 15 and FIG. 16 are merely exemplary of possible configurations of a processing chamber with a plasma source assembly and should not be taken as limiting the scope of the disclosure.

The coaxial RF feed line 380 includes an outer conductor 382 and an inner conductor 384 separated by an insulator 386 (not shown). The inner conductor 384 is in electrical communication with the RF hot electrode 320 and outer conductor 382 is in electrical communication with electrical ground or a different phase power source (not shown) than the RF hot electrode. As used in this specification and the appended claims, the term "electrical communication" means that the components are connected either directly or through an intermediate component so that there is little electrical resistance. The gap between inner conductor 384 and outer conductor 382 can be filled with a dielectric, which may be ceramic, but can be any suitable dielectric material.

The coaxial RF feed line 380 may be constructed so that the outer conductor 382 terminates on the return electrode 330. The inner conductor 384 can terminate on the RF hot electrode 320. In some embodiments, the gas inlet 315 is fed to the housing around the outside periphery of the coaxial feed. The RF feed may be in the form of a coaxial transmission line. The outer conductor can be connected/terminated in the return electrode, and the inner conductor is connected to the RF hot electrode. The return electrode 330 can be connected to the metal housing by any suitable method including, but not limited to, a metal gasket. This helps to ensure a symmetric geometry of the return currents. All return currents flow up the outer conductor of the feed, minimizing RF noise. In some embodiments, the RF feed is designed to provide symmetric RF feed current to the RF hot electrode, and symmetric return currents. All return currents flow up the outer conductor, minimizing RF noise, and minimizing impact of source installation on operation.

For a linear radial plasma source, like that shown in FIGS. 7-10, in any processing system that uses a rotating susceptor (platen), the plasma exposure (treatment) is greater at the inner diameter (ID) of the wafer compared to the outer diameter (OD) of the wafer. In a system with a coaxial feed connected to the approximate center of the hot electrode, the difference between the ID and OD exposure can be about 2.7 times. Currently, the coaxial feed is connected to the hot electrode at about the center of the electrode. This connection configuration may not provide uniform plasma exposure at the ID and OD of the wafer. One or more embodiments of the disclosure advantageously provide simple linear design plasma source. Some embodiments advantageously provide an inner diameter feed at high frequency or very high frequency with increasing plasma flux from the wafer ID to OD.

It has been observed that a low electric field appears near the ID and a high electric field near the OD. The electric field saturates near the OD. As a result of the power distribution for a power connection near the ID, plasma density and ion flux do not increase linearly. In addition, the power is distributed over a larger volume leading to lower plasma density and ion flux near wafer OD. This can lead to edge roll off that adversely affects process performance. Accordingly, some embodiments of the disclosure advantageously provide apparatus to enhance the power distribution to the electrodes near the OD by using a shaped RF hot electrode.

Figure 14:
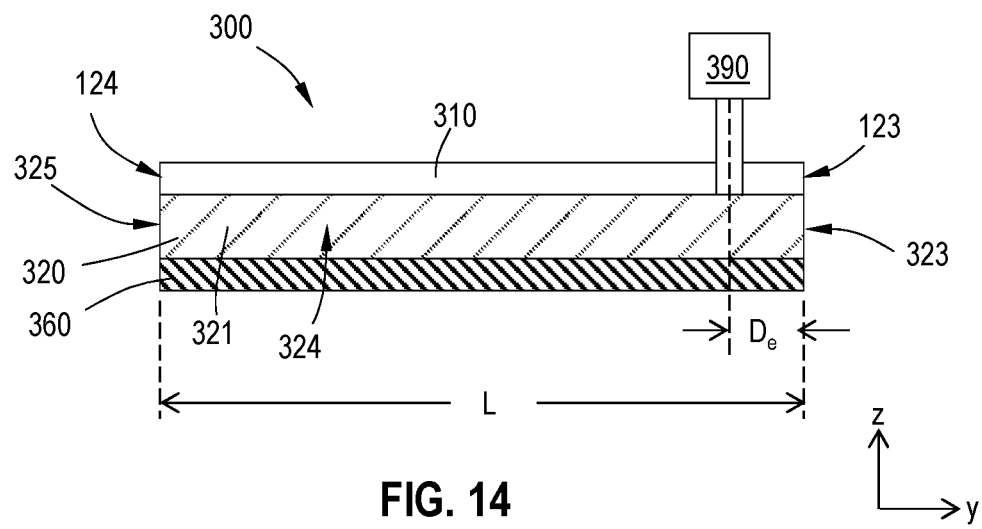
FIG. 14 shows a partial cross-sectional view of a plasma source assembly in accordance with one or more embodiments of the disclosure.

Referring to FIGS. 13 and 14, the vertical plasma source (VPS) can be a linear plasma source with a powered electrode (hot electrode) and return electrode that extend from the ID to OD of the wafer and beyond. The gap between the hot electrode and return electrode can be substantially uniform along the length of the electrodes from the ID to OD.

Generally, the electric field (and plasma flux) generated in a plasma assembly is greatest near the RF feed with field strength decreasing with distance from the RF feed. In the linear vertical plasma source, the minimum electric field and plasma density occurs surprisingly underneath the RF feed. Without being bound by any particular theory of operation, it is believed that this is due to electromagnetic effects which increase with the frequency of the RF power. The inventors have found that moving the RF feed toward the ID end of the hot electrode can compensate for the exposure non-uniformity.

The power source 390 can be operated at any suitable frequency. It has been found that higher frequency power may create a plasma density variation that can compensate for the differing exposure between the ID and OD due to susceptor rotation. In some embodiments, the power source 390 is operated at high frequency (20-30 MHz) or at very high frequency (30-100 MHz). In some embodiments, the power source 390 is operated at 60 MHz.

Referring to FIGS. 13 through 16, one or more embodiments of the disclosure is directed to a plasma source assembly 300. The plasma source assembly 300 includes a housing 310, shown in FIG. 15. The housing 310 of some embodiments holds or supports all of the components of the plasma source assembly except the power connection or gas line connections that might be used. Combined into one housing, the plasma source assembly can be modular; allowing the assembly to be moved, added to or removed from a processing apparatus. The housing 310 of some embodiments is wedge-shaped to fit into a gas distribution assembly 120 like that shown in FIG. 4 or 5. While the housing 310 may be wedge-shaped, the shape of the plasma cavity or gap in which the plasma is formed, can be linear. The embodiment illustrated in FIG. 13 does not show the housing for descriptive purposes.

FIG. 14 shows a partial cross-sectional side view of the plasma source assembly 300 of some embodiments. The housing 310 has an inner peripheral edge 123 and an outer peripheral edge 124 that can be aligned with the gas distribution assembly 120 illustrated in FIGS. 4 and 5.

As shown in FIG. 15, the housing 310 may include a gas inlet 315 to form a flow path 318 from the gas inlet 315 to allow a flow of gas to pass through the housing 310 and out an opening 313 in the front face 312 of the plasma source assembly 300. The front face 312 can be formed by the housing 310, the RF hot electrode 320, the return electrode 330, or any suitable material that can be positioned a distance from the susceptor assembly. In some embodiments, the front face 312 is formed from a combination of separate components resulting in a mixture of materials.

Similarly, as shown in FIG. 16, the lower housing 403 may include a non-conductive showerhead 480 to form a flow path 318 from the gas inlet 315 (not shown) to allow a flow of gas to pass through the lower housing 403 and out an opening 313 in the front face 312 of the plasma source assembly 300. The front face 312 can be formed by the lower housing 403, the RF hot electrode 320, the showerhead 480, or any suitable material that can be positioned a distance from the susceptor assembly. In some embodiments, the front face 312 is formed from a combination of separate components resulting in a mixture of materials.

The plasma source assembly includes an RF hot electrode 320 with an elongate body 321 that includes a first surface 322 and a second surface 324 opposite the first surface 322. The first surface 322 and second surface 324 define the width of the RF hot electrode 320. In some embodiments, the first surface 322 and second surface 324 are substantially parallel. As used in this regard, the term substantially parallel means that the surfaces form major planes that are within $\pm 10°$, $\pm 9°$, $\pm 8°$, $\pm 7°$, $\pm 6°$, $\pm 5°$, $\pm 4°$, $\pm 3°$, $\pm 2°$ or $\pm 1°$ of being parallel. In some embodiments, the width of the RF hot electrode 320 is in the range of about 2 mm to about 20 mm, or in the range of about 3 mm to about 15 mm, or in the range of about 4 mm to about 10 mm, or in the range of about 5 mm to about 9 mm, or in the range of about 6 mm to about 8 mm, or about 7 mm.

As shown in FIG. 14, the elongate body 321 of the RF hot electrode 320 has an inner peripheral end 323 and an outer peripheral end 325. The inner peripheral end 323 of the RF hot electrode 320 is positioned within the housing 310 near the inner peripheral edge 123 of the housing 310. The outer peripheral end 325 of the RF hot electrode 320 is positioned within the housing 310 near the outer peripheral edge 124 of the housing 310. The inner peripheral end 323 and outer peripheral end 325 define a length L of the RF hot electrode 320. The embodiment illustrated in FIG. 14 shows the housing 310 having about the same length as the RF hot electrode 320. This is merely representative of one possible configuration and should not be taken as limiting the scope of the disclosure. The housing of some embodiments extends beyond the ends of the RF hot electrode and may wrap around at least some of the RF hot electrode. The length L of the RF hot electrode 320 of some embodiments is in the range of about 160 mm to about 440 mm. The length L of the RF hot electrode 320 can be configured to span the width of a substrate to be processed. For example, if the substrates being processed are 200 mm diameter wafers, the RF hot electrode can have a length L in the range of about 160 mm to about 440 mm, or in the range of about 180 mm to about 220 mm, or in the range of about 190 mm to about 210 mm, or in the range of about 195 mm to about 205 mm. If the substrates being processed are 300 mm diameter wafers, the RF hot electrode can have a length L in the range of about 160 mm to about 440 mm, or in the range of about 260 mm to about 440 mm, or in the range of about 280 mm to about 320 mm, or in the range of about 290 mm to about 310 mm, or in the range of about 295 mm to about 305 mm.

A return electrode 330 can be any component that is suitable to allow a return current to flow or provide an opposite polarity voltage from the RF hot electrode. The term "return electrode" is used to represent an electrical connection that forms a complete circuit with the RF hot electrode and should not be taken as implying a direction for a flow of current or electrons. The return electrode 330 of some embodiments is the housing 310. The return electrode 330 of some embodiments is the housing 310. In some embodiments, the return electrode 330 is a separate component within the housing 310. The return electrode 330 can be made from the same material as the housing 310 but be electrically isolated from the housing 310, or the return electrode 330 can be made from a different material than the housing 310. In the embodiments illustrated, the return electrode 330 is a different material than the housing 310. The return electrode 330 of some embodiments has an elongate body that extends from the inner peripheral edge to the outer peripheral edge of the housing. The return electrode is spaced from the RF hot electrode 320 to provide a gap 340 in which a plasma can form.

The RF feed 380 connects to the RF hot electrode at a distance De from the inner peripheral edge 323 of the RF hot electrode 320. The distance De of some embodiments is less than or equal to about 25% of the length L of the RF hot electrode 320. In some embodiments, the distance De is less than or equal to about 20%, 15%, 10%, 5%, 4%, 3%, 2% or 1% of the length L of the RF hot electrode 320.

The electrodes of some embodiments are enclosed by inner and outer cladding made from a dielectric material to minimize metal contamination. The "inner cladding" can be used to refer to the cladding associated with the RF hot electrode and the "outer cladding" can be used to refer to the cladding associated with the return electrode. A gap is maintained between the bottom of the cladding and the wafer/susceptor that exposes plasma to the wafer.

As illustrated in FIG. 15 and FIG. 16, in some embodiments the RF hot electrode 320 has RF hot electrode cladding 360 positioned so that the RF hot electrode 320 is not exposed directly to the substrate or susceptor assembly. As used in this manner, the term "not exposed directly" and the like means that an atom ejected from the RF hot electrode 320 cannot travel a straight path to impact the surface of the substrate. In the embodiment shown, the RF hot electrode cladding 360 wraps around all exposed sides and surfaces of the RF hot electrode 320. The RF hot electrode cladding 360 of some embodiments comprises one or more of silicon or silicon oxide. In some embodiments, the RF hot electrode cladding 360 comprises or consists essentially of quartz. In some embodiments, the RF hot electrode cladding 360 is made from a material that is not sputtered as a contaminant on a wafer being processed. The RF hot electrode cladding 360 materials may depend on the process or deposition being performed.

As illustrated in FIG. 15, in some embodiments, the return electrode 330 includes a return electrode cladding 361. The return electrode cladding 361 of some embodiments is positioned so that the return electrode 330 is not directly exposed to the substrate or susceptor surface. In some embodiments, the return electrode cladding 361 comprises one or more of silicon, silicon oxide or aluminum oxide.

The return electrode cladding 361 of some embodiments comprises a material that is different from the RF hot electrode cladding 360. In some embodiments, the RF hot electrode cladding 360 and the return electrode cladding 361 are made from the same material. In some embodiments, the RF hot electrode cladding 360 comprises quartz and the return electrode cladding comprises aluminum oxide. In some embodiments, the RF hot electrode cladding 360 consists essentially of quartz and/or the return electrode cladding consists essentially of aluminum oxide. As used in this manner, the term "consists essentially of" means that the composition of the subject cladding is greater than or equal to about 95%, 98% or 99% of the stated material on a weight basis.

The RF hot electrode cladding 360 and return electrode cladding 361 can form the front face 312 of the plasma source assembly 300. The distance Gh from the RF hot electrode cladding 360 to the substrate 60 can be the same as or different from the distance Gr from the return electrode cladding 361 to the substrate 60.

As illustrated in FIG. 16, in some embodiments, the lower housing 403 acts as a return electrode. In some embodiments, the lower house 403 is positioned so that the return electrode 330 is not directly exposed to the substrate or susceptor surface. In some embodiments, the lower housing 403 comprises the showerhead 480. In some embodiments, the cladding 360 forms the front face 312 of the plasma source assembly 300. In some embodiments, the cladding 360 covers the front face 312 comprising a portion of the first side 322 of the RF hot electrode 320, a portion of the second side 324 of the RF hot electrode 320, a bottom surface 390 of the RF hot electrode 320, a portion of surface of showerhead 485, 485b, and a portion of a surface of lower housing 475, 475b. In some embodiments, the cladding 360 comprises one or more of quartz, silicon, silicon oxide or aluminum oxide.

In some embodiments, metal contamination is reduced by applying nickel plating to the outer housing surfaces susceptible to contributing contamination and also by covering those surfaces with quartz. If cleaned properly it contributes very little contamination. Quartz also surrounds the electrode to prevent metal sputter or transfer from the electrode to the wafer.

Additional embodiments of the disclosure are directed to methods of processing a substrate. A substrate 60 is positioned on a susceptor assembly 140 adjacent a gas distribution assembly 120. The gas distribution assembly 120 includes a plasma source assembly in accordance with one or more embodiments of the disclosure. A gas is flowed through the gas inlet 315 of the housing 310 into the gap 340 between the RF hot electrode 320 and the return electrode 330. The RF hot electrode 320 is energized through the RF feed 380 positioned within 25% of the length L of the RF hot electrode 320 measured from the inner peripheral end 323 to form a plasma in the gap 340. The plasma flows out the front face 312 of the housing 310 to expose the substrate 60 to the plasma.

The plasma source assembly 300 of some embodiments provides a plasma with an ion flux generated at the inner peripheral end 323 of the RF hot electrode 320 that is less than an ion flux generated at the outer peripheral end 325 of the RF hot electrode 320.

Moving the RF feed toward the inner diameter provides an increase in the plasma flux from the ID toward the OD. However, it has been found that there is a roll off (lower ion flux) in the last 25-30 mm of wafer OD that may adversely impact process performance. Accordingly, one or more embodiments of the disclosure advantageously provide apparatus and methods to increase the plasma flux uniformity.

In some embodiments, the power distribution profile may be improved by increasing the RF coupling between the powered electrode (RF hot electrode 320) and ground (return electrode 330) where deposition is low. In some embodiments, the power distribution profile can be improved by decreasing the RF coupling between the powered electrode and ground where deposition is high. The RF coupling can be modulated by different techniques including, but not limited to, changing the spacing between the RF hot electrode 320 and the cladding 360, changing the spacing between the return electrode 330 and the outer cladding 361, changing the thickness of the cladding 360 and/or changing the thickness of the outer cladding 361.

Additional embodiments of the disclosure are directed to methods of processing a plurality of substrates. The plurality of substrates is loaded onto substrate support in a processing chamber. The substrate support is rotated to pass each of the plurality of substrates across a gas distribution assembly to deposit a film on the substrate. The substrate support is rotated to move the substrates to a plasma region adjacent a capacitively coupled plasma source generating substantially uniform plasma in the plasma region. This is repeated until a film of predetermined thickness is formed.

Rotation of the carousel can be continuous or discontinuous. In continuous processing, the wafers are constantly rotating so that they are exposed to each of the injectors in turn. In discontinuous processing, the wafers can be moved to the injector region and stopped, and then to the region between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing between each layer deposition (e.g., exposure to plasma).

The frequency of the plasma may be tuned depending on the specific reactive species being used. Suitable frequencies include, but are not limited to, 400 kHz, 2 MHz, 13.56 MHz, 27 MHz, 40 MHz, 60 MHz and 100 MHz.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Some embodiments of the disclosure are directed to methods of depositing a film. The method comprises positioning at least one substrate having a thickness on a top surface of a susceptor assembly in a processing chamber and exposing a substrate surface to one or more deposition cycles. The deposition cycle comprises exposing the substrate surface to a reactive gas in a first processing region of the processing chamber, moving the substrate surface from the first processing region through a gas curtain to a second processing region, exposing the substrate surface to a second reactive gas in the second processing region, moving the substrate surface from the second processing region through a gas curtain to a plasma processing region, using a compression element configured to force the RF plasma processing region vertically for reducing a gap between the RF plasma processing region and the substrate surface, exposing the substrate surface to a plasma process in the plasma processing region, and repeating the deposition cycle until the thickness of the substrate surface is in the range of 1 nm to 200 nm.

Some embodiments of the disclosure are directed to methods of alignments for a plasma source. The method comprises determining a matching planarity for the plasma source assembly to a top surface of the susceptor assembly to find a first adjustment parameter, determining a distance required between the top surface of the susceptor assembly and the plasma source assembly to find a second adjustment parameter, revising the first adjustment parameter based on the second adjustment parameter to find a third parameter, and vertically adjusting a position of the plasma source based on the third parameter.

Figure 17:
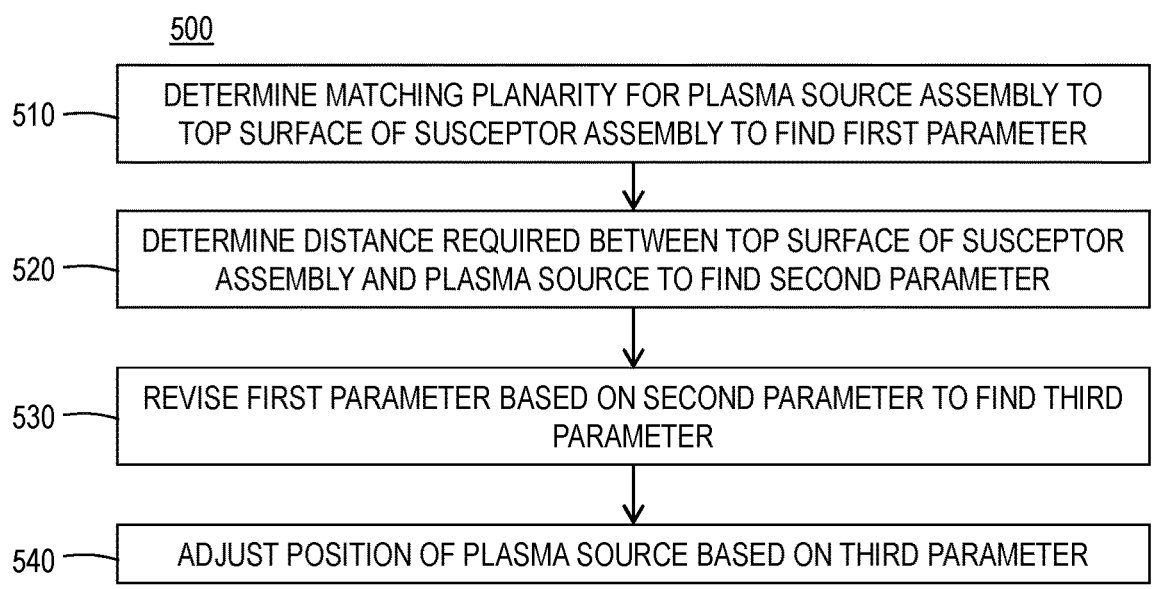
FIG. 17 is a flow chart of a method according to an embodiment of the disclosure.

FIG. 17 shows a flowchart of a method 500 according to one or more embodiments. At 510, a matching planarity for the plasma source assembly to a top surface of the susceptor assembly is determined to find a first adjustment parameter. At 520, a distance required between the top surface of the susceptor assembly and the plasma source assembly is determined to find a second adjustment parameter. At 530, the first adjustment parameter is revised based on the second adjustment parameter to find a third parameter. At 540, a position of the plasma source is vertically adjusted based on the third parameter.

While the foregoing is directed to embodiments of the present disclosure, other and further embodiments of the disclosure may be devised without departing from the basic scope thereof, and the scope thereof is determined by the claims that follow.

What is claimed is:

1. A plasma source comprising:
   an upper housing having an inner peripheral edge and an outer peripheral edge, a top surface, and a bottom surface;
   a lower housing having an inner peripheral edge and an outer peripheral edge, a top surface and a bottom surface, the lower housing acting as a return electrode;
   a top cover having an inner peripheral edge, an outer peripheral edge, a top surface, and a bottom surface, the top cover connected to and spaced a distance from the top surface of the upper housing by one or more differential screw assembly, wherein the distance between the top surface of the upper housing and the bottom surface of the top cover is vertically adjustable; and
   an RF hot electrode bounded by and spaced from the lower housing defining a gap therebetween, the RF hot electrode having an inner end adjacent to and spaced from the inner peripheral edge of the lower housing, an outer end adjacent to and spaced from the outer peripheral edge of the lower housing, an upper edge spaced from the bottom surface of the upper housing, and a bottom edge.

2. The plasma source of claim 1, wherein the gap between the lower housing and the RF hot electrode is in a range of about 3 mm to about 15 mm.

3. The plasma source of claim 2, wherein the RF hot electrode has a thickness in a range of from about 3 mm to about 11 mm.

4. The plasma source of claim 2, wherein the RF hot electrode has a height in a range of from about 8 mm to about 40 mm.

5. The plasma source of claim 1, wherein the RF hot electrode has a bottom surface with a non-conductive cladding.

6. The plasma source of claim 5, wherein the non-conductive cladding comprises quartz.

7. The plasma source of claim 1, wherein a cladding layer covers a portion of a first side of the RF hot electrode and a portion of a second side of the RF hot electrode that forms the gap.

8. The plasma source of claim 7, wherein the cladding layer has a length in a range of about 10 mm to about 25 mm.

9. The plasma source of claim 7, wherein the cladding layer has a thickness in a range of about 0.25 mm to about 2.5 mm.

10. The plasma source of claim 7, wherein the cladding layer covers a portion of a surface of non-conductive showerhead and a portion of a surface of the lower housing that forms the gap to create inverted u-shaped channels.

11. The plasma source of claim 7, wherein a plasma is ignited in inverted u-shaped channels on either side of the RF hot electrode.

12. The plasma source of claim 1, further comprising one or more of: a gas inlet connected to the top surface of the upper housing; a plurality of apertures in the top surface of the lower housing to allow a flow of gas to pass from a plenum gap through a non-conductive showerhead to the gap between the RF hot electrode and the lower housing; or a cladding layer covering a bottom portion of an inside surface of the lower housing, a portion of a bottom surface of the non-conductive showerhead and the lower housing forming an inverted u-shaped channel on either side of the RF hot electrode.

13. The plasma source of claim 12, comprising the plurality of apertures in the top surface of the lower housing, wherein the non-conductive showerhead separates the RF hot electrode and the top surface of the lower housing comprising a conductive material, and the non-conductive showerhead has a plurality of apertures extending from a top surface of the showerhead through a bottom surface of the showerhead to allow the flow of gas to pass through the non-conductive showerhead.

14. The plasma source of claim 12, wherein the gas inlet is in fluid communication through the upper housing with a plenum gap between the bottom surface of the upper housing and the top surface of the lower housing.

15. The plasma source of claim 1, wherein the differential screw assembly comprises an adjustment screw extending through the top cover into the upper housing.

16. The plasma source of claim 1, wherein the upper housing has an adjustment recess in the top surface with a compression element, the compression element configured to provide force to the bottom surface of the top cover to separate the top cover from the upper housing and the top cover is actively cooled.

17. The plasma source of claim 1, wherein the RF hot electrode extends from an RF feed connector through the upper housing, the RF feed connector having a power connector end with a hard stop to prevent force applied by a power line connected to the power connector end from transferring to the RF hot electrode and the RF feed connector passes through the top cover into a recess formed in the top surface of the upper housing.

18. The plasma source of claim 17, wherein the RF hot electrode passes through an insulating sleeve positioned within the upper housing, the insulating sleeve preventing direct electrical communication between the RF hot electrode and the upper housing.

19. The plasma source of claim 1, wherein the plasma source further comprises
   a compression element in the top surface of the upper housing, the compression element configured to provide force to the bottom surface of the top cover to separate the top cover from the upper housing;
   one or more cooling wings in the top cover;
   one or more chamber cooling plates extending from the top surface of the upper housing into a complementary recess formed in the bottom surface of the top cover; and
   one or more cooling fins between the upper housing and top cover and cooling wings that create contact between the top cover and chamber cooling plates.

20. The plasma source of claim 12, comprising the plurality of apertures in the top surface of the lower housing and the cladding layer, wherein the cladding layer includes a plurality of apertures to allow a flow of gas from the non-conductive showerhead to pass into the inverted u-shaped channel on either side of the RF hot electrode.

* * * * *

UNITED STATES PATENT AND TRADEMARK OFFICE
CERTIFICATE OF CORRECTION

PATENT NO. : 12,288,677 B2  
APPLICATION NO. : 18/205690  
DATED : April 29, 2025  
INVENTOR(S) : Tsutomu Tanaka et al.

Page 1 of 1

It is certified that error appears in the above-identified patent and that said Letters Patent is hereby corrected as shown below:

In the Specification

• Column 21, Line 60, replace "De" after "distance" and before "from the inner peripheral" with "$D_e$".

• Column 21, Line 61, replace "De" after "The distance" and before "of some embodiments" with "$D_e$".

• Column 21, Line 63, replace "De" after "the distance" and before "is less" with "$D_e$".

• Column 22, Line 48, replace "Gh" after "The distance" and before "from the RF hot" with "$G_h$".

• Column 22, Line 50, replace "Gr" after "the distance" and before "from the return electrode" with "$G_r$".

Signed and Sealed this  
Fifteenth Day of July, 2025

Coke Morgan Stewart  
*Acting Director of the United States Patent and Trademark Office*